(12) United States Patent
Kim et al.

(10) Patent No.: US 9,559,102 B2
(45) Date of Patent: Jan. 31, 2017

(54) SEMICONDUCTOR DEVICE

(71) Applicant: SAMSUNG ELECTRONICS CO., LTD., Suwon-si, Gyeonggi-do (KR)

(72) Inventors: Yoonhae Kim, Suwon-si (KR); Myungil Kang, Yongin-si (KR); Sooyeon Jeong, Hwaseong-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 14/976,105

(22) Filed: Dec. 21, 2015

(65) Prior Publication Data

US 2016/0307898 A1    Oct. 20, 2016

(30) Foreign Application Priority Data

Apr. 14, 2015    (KR) .................. 10-2015-0052494

(51) Int. Cl.
*H01L 29/78* (2006.01)
*H01L 27/092* (2006.01)
*H01L 27/088* (2006.01)

(52) U.S. Cl.
CPC ....... *H01L 27/0922* (2013.01); *H01L 27/0886* (2013.01); *H01L 27/0924* (2013.01); *H01L 29/785* (2013.01)

(58) Field of Classification Search
CPC ............ H01L 27/0924; H01L 27/0886; H01L 29/785; H01L 21/823431; H01L 21/823821; H01L 21/845
See application file for complete search history.

(56) References Cited

U.S. PATENT DOCUMENTS

| 7,307,025 B1 | 12/2007 | Worsham et al. |
| 8,299,564 B1 | 10/2012 | Wu et al. |
| 8,765,546 B1* | 7/2014 | Hung ............... H01L 21/82343 257/190 |
| 2008/0166841 A1* | 7/2008 | Hsieh ............... H01L 21/82380 438/229 |
| 2009/0212368 A1* | 8/2009 | Yang ............... H01L 21/82341 257/368 |
| 2010/0167505 A1* | 7/2010 | Chew ............... H01L 21/02532 438/503 |
| 2012/0319203 A1* | 12/2012 | Cheng ............... H01L 29/66666 257/346 |

(Continued)

*Primary Examiner* — Jarrett Stark
*Assistant Examiner* — Bitew Dinke
(74) *Attorney, Agent, or Firm* — F. Chau & Associates, LLC

(57) ABSTRACT

A semiconductor device includes first and second active regions. Each active region includes a plurality of fin protrusions and a recessed area disposed between the fin protrusions. A plurality of gate structures are disposed on each of the plurality of fin protrusions. A semiconductor layer is disposed in each recessed area. A distance between the gate structures of the first active region is the same as a distance between the gate structures of the second active region, and a height difference between a bottom surface of the semiconductor layer of the first recessed area and a top surface of each of the fin protrusions of the first active region is smaller than a height difference between a bottom surface of the semiconductor layer of the recessed area of the second active region and a top surface of each of the fin protrusions of the second active region.

18 Claims, 34 Drawing Sheets

(56) References Cited

U.S. PATENT DOCUMENTS

| | | | |
|---|---|---|---|
| 2013/0134520 A1* | 5/2013 | Maeda | H01L 21/82341 257/368 |
| 2013/0285143 A1* | 10/2013 | Oh | H01L 21/82382 257/347 |
| 2013/0285153 A1* | 10/2013 | Lee | H01L 21/02532 257/369 |
| 2013/0309857 A1* | 11/2013 | Koburger, III | H01L 27/088 438/591 |
| 2014/0061814 A1* | 3/2014 | Kim | H01L 21/82385 257/369 |
| 2014/0239255 A1* | 8/2014 | Kang | H01L 29/775 257/24 |
| 2014/0246696 A1* | 9/2014 | Flachowsky | H01L 29/7848 257/190 |
| 2014/0327046 A1 | 11/2014 | Huang et al. | |
| 2015/0104913 A1* | 4/2015 | Liu | H01L 21/82382 438/229 |
| 2015/0179654 A1* | 6/2015 | Mehrotra | H01L 27/1104 257/77 |
| 2015/0318282 A1* | 11/2015 | Rodder | H01L 27/0886 257/392 |
| 2016/0049483 A1* | 2/2016 | Zhang | H01L 29/785 257/401 |
| 2016/0079353 A1* | 3/2016 | Chen | H01L 27/0886 257/401 |
| 2016/0104704 A1* | 4/2016 | Fang | H01L 29/4966 257/392 |

* cited by examiner

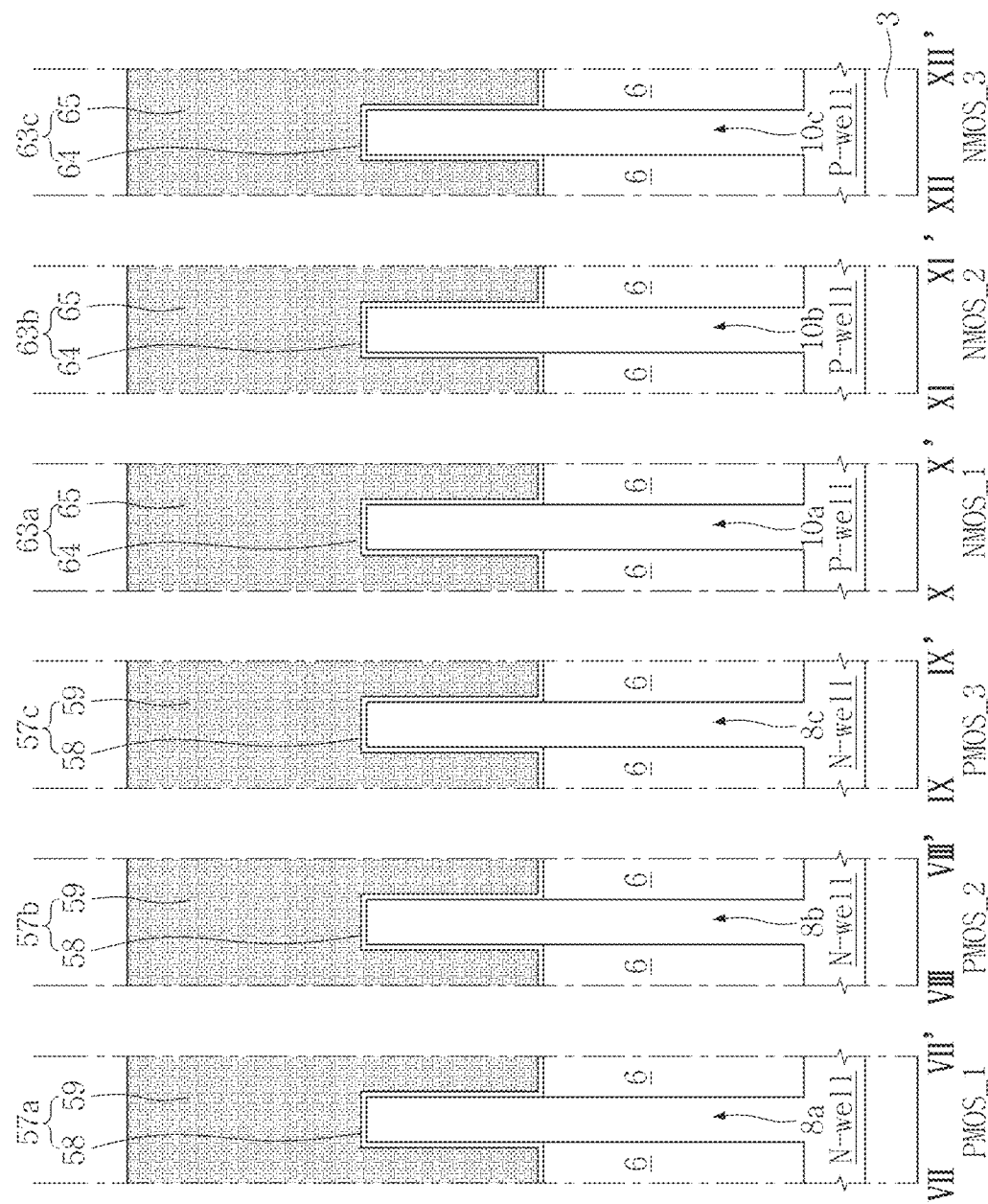

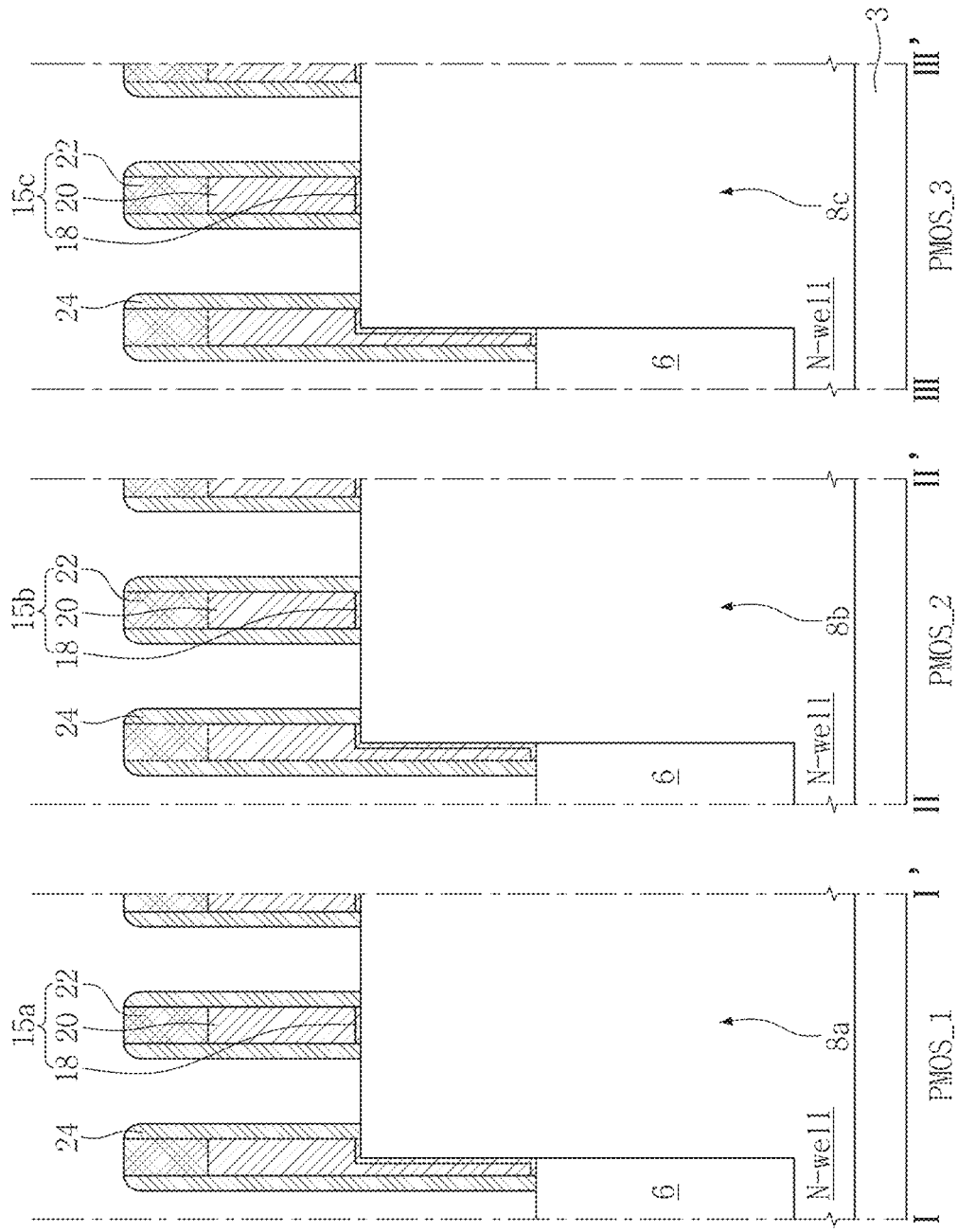

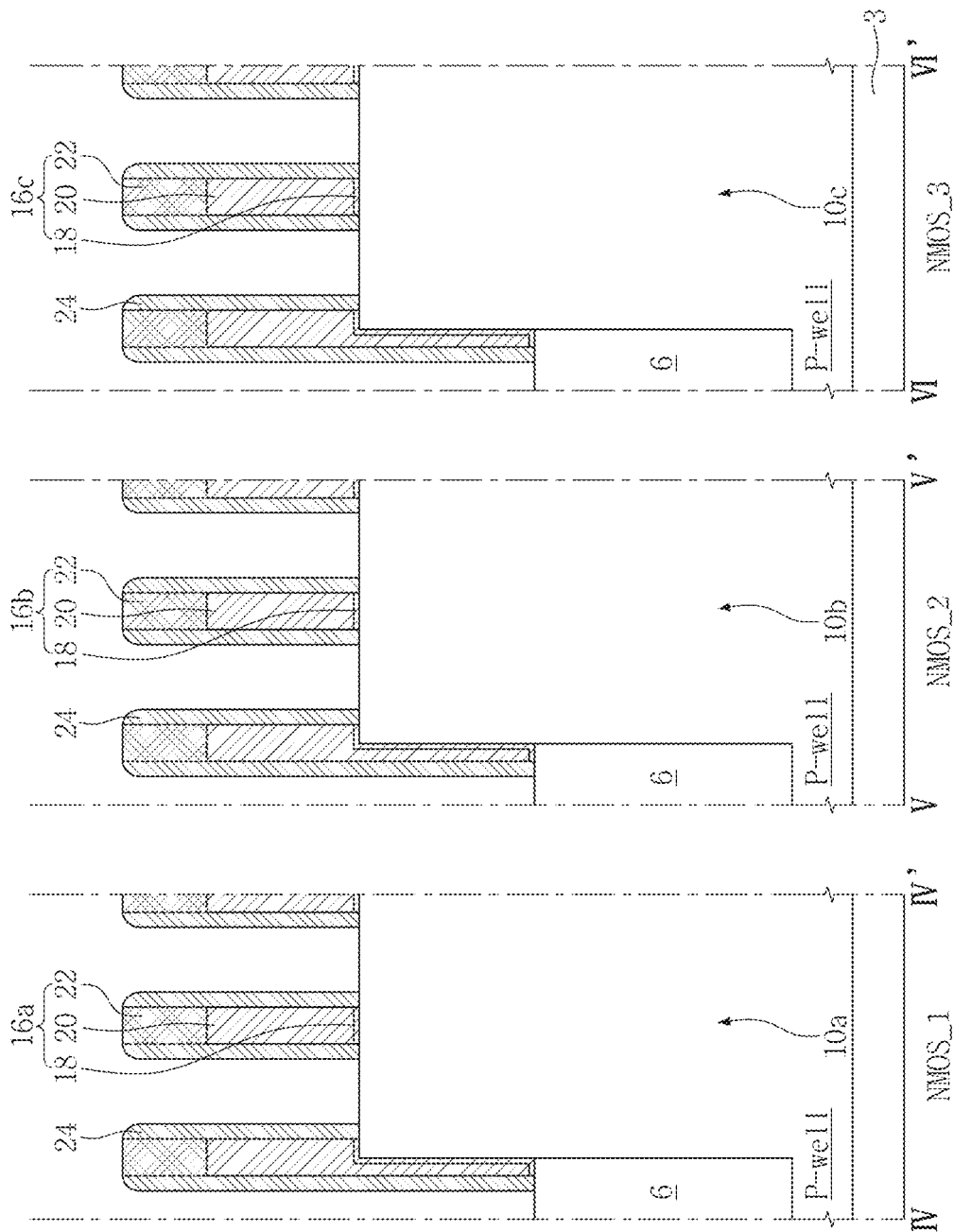

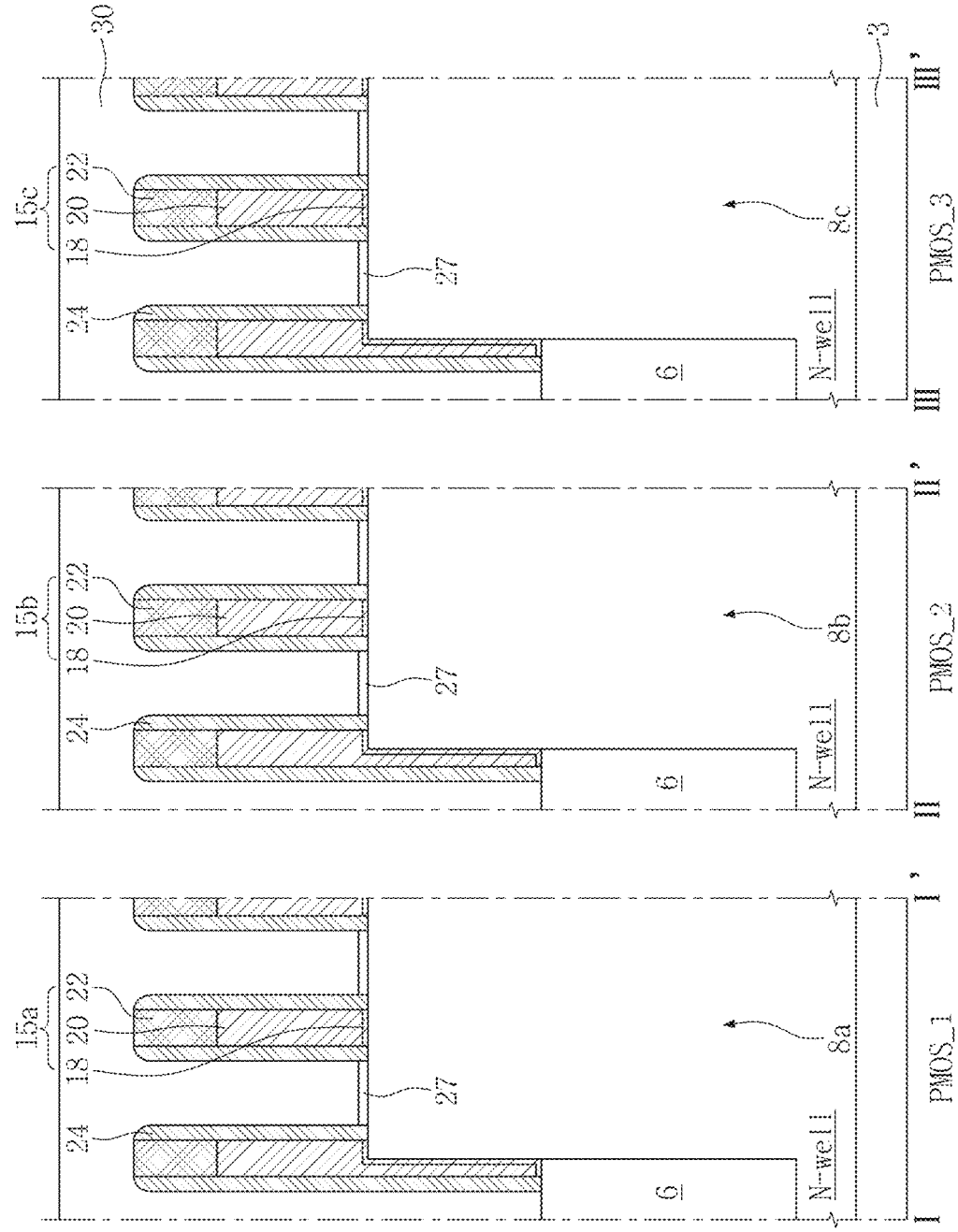

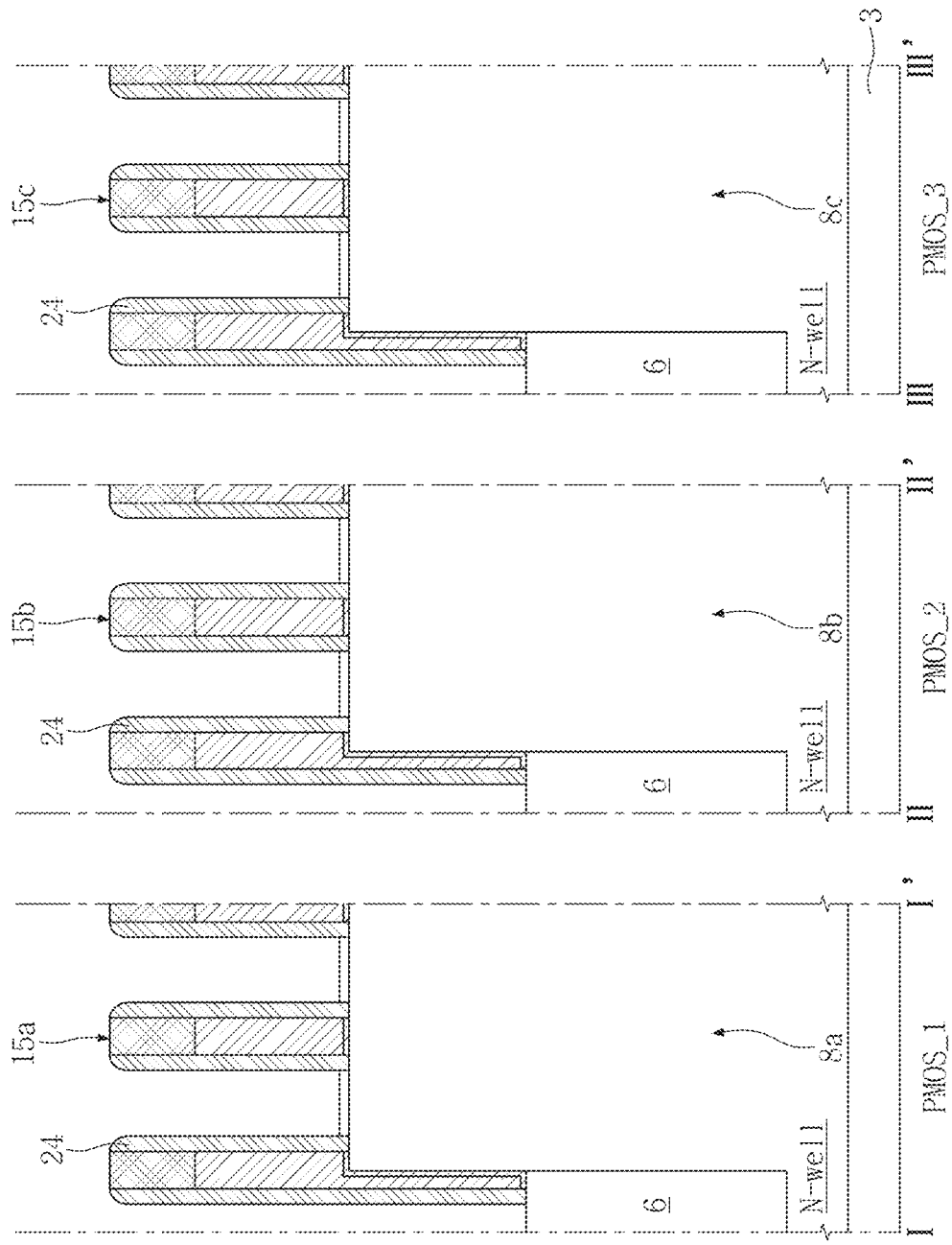

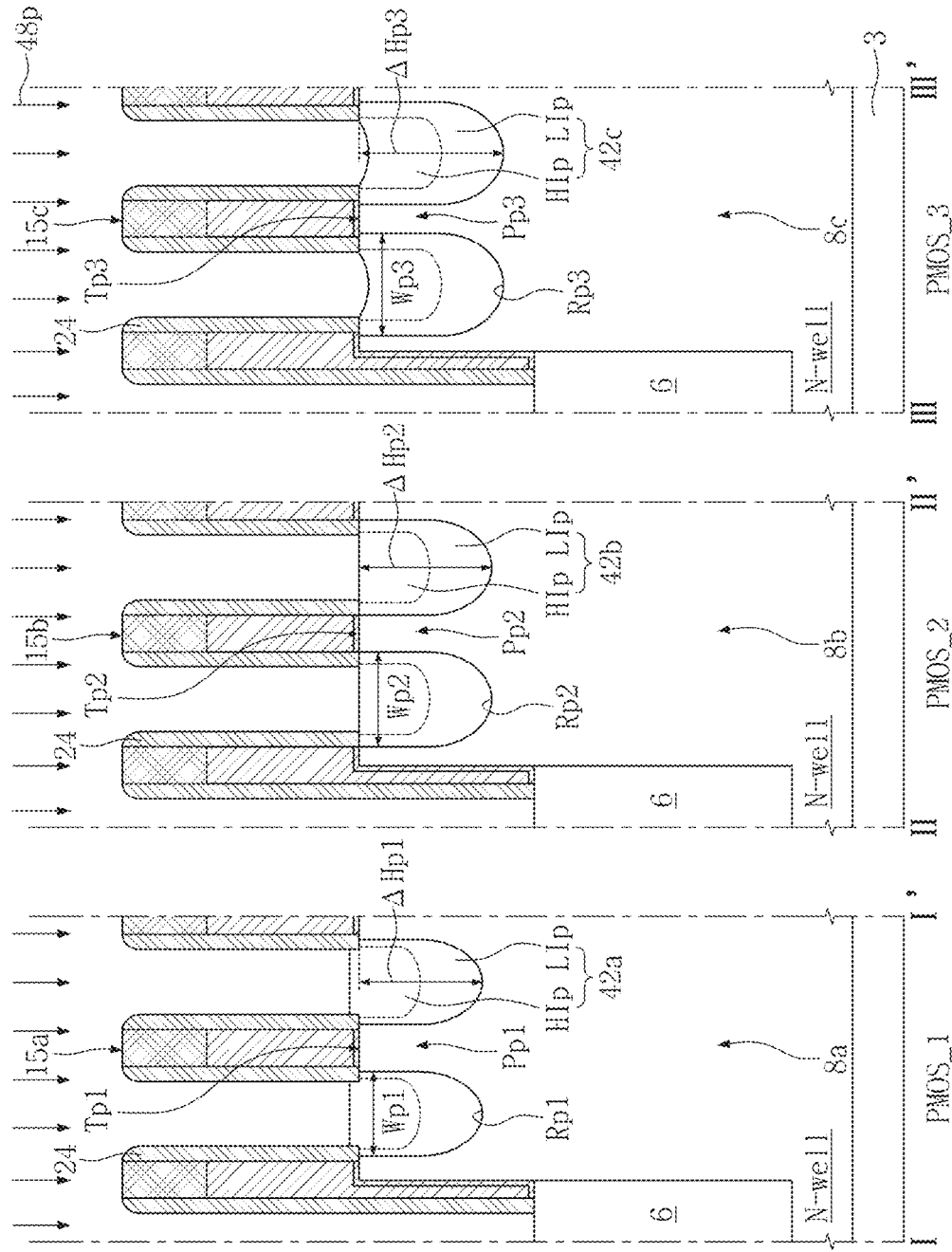

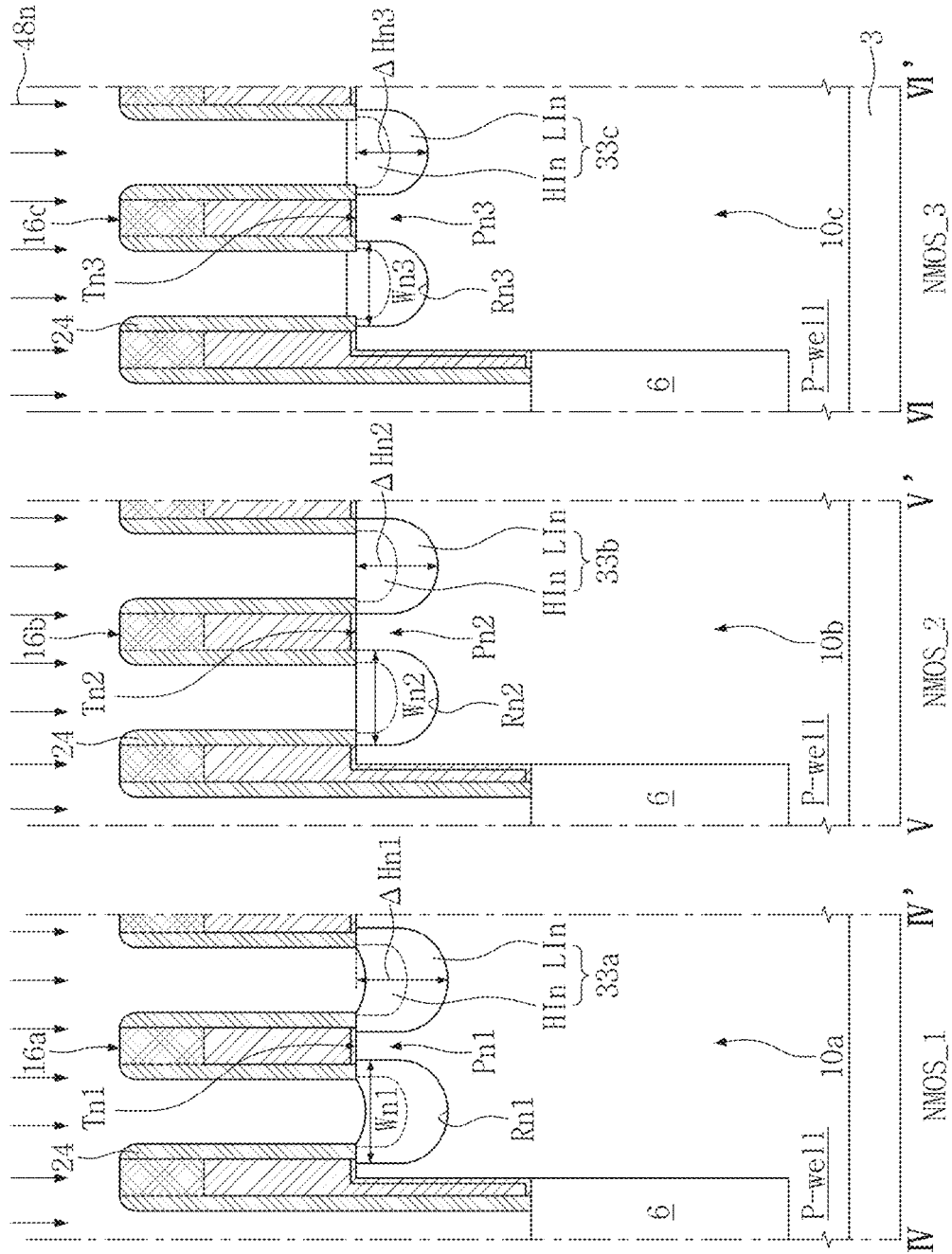

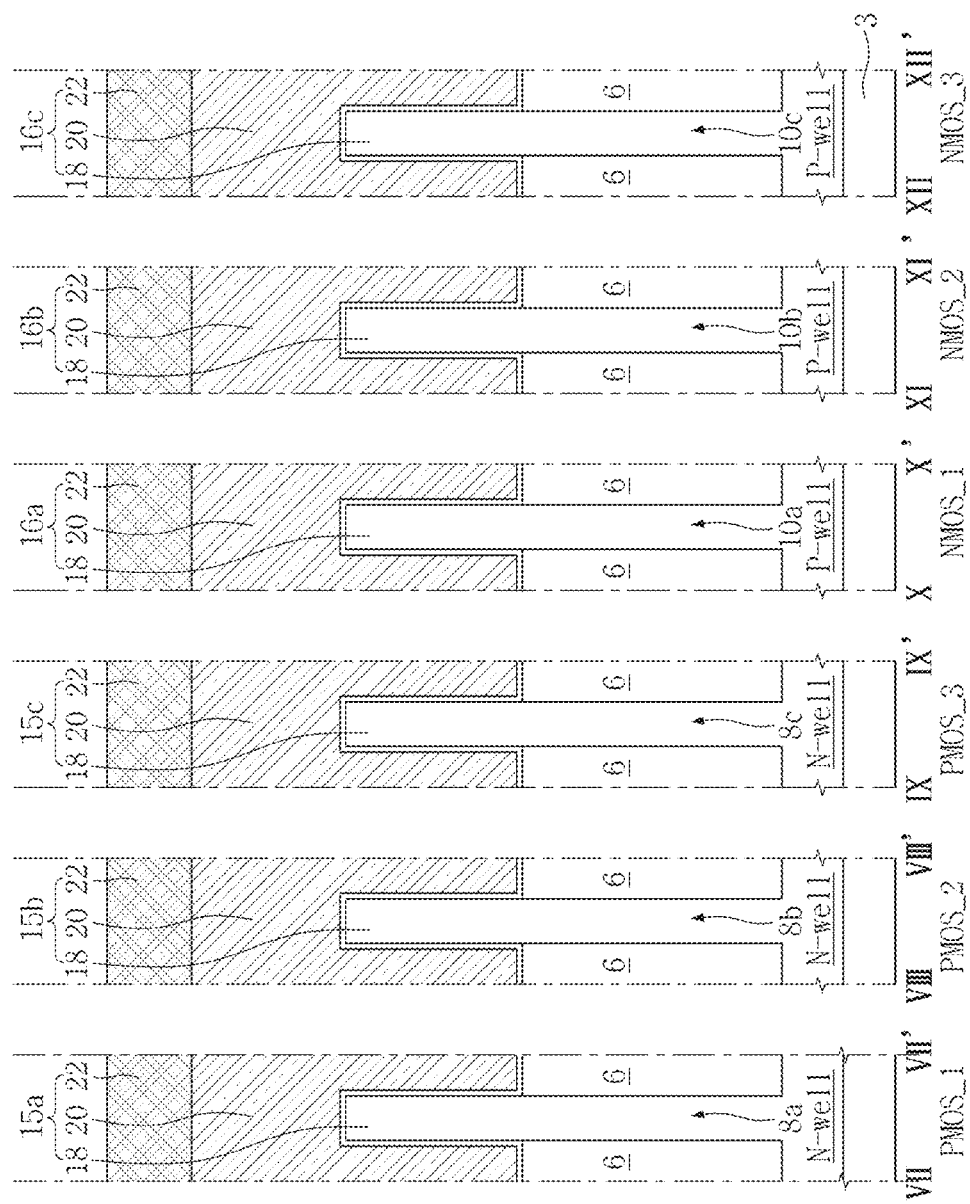

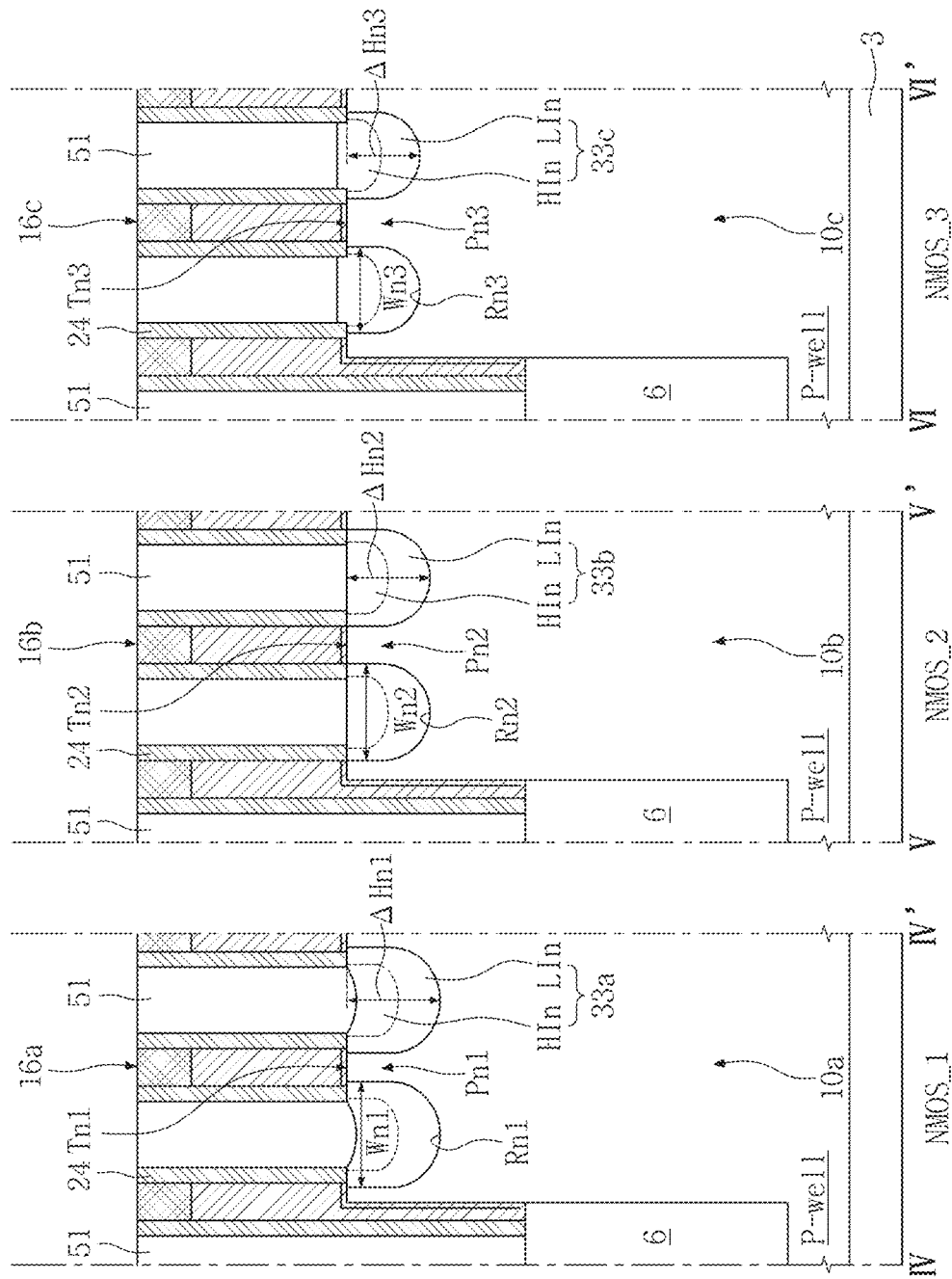

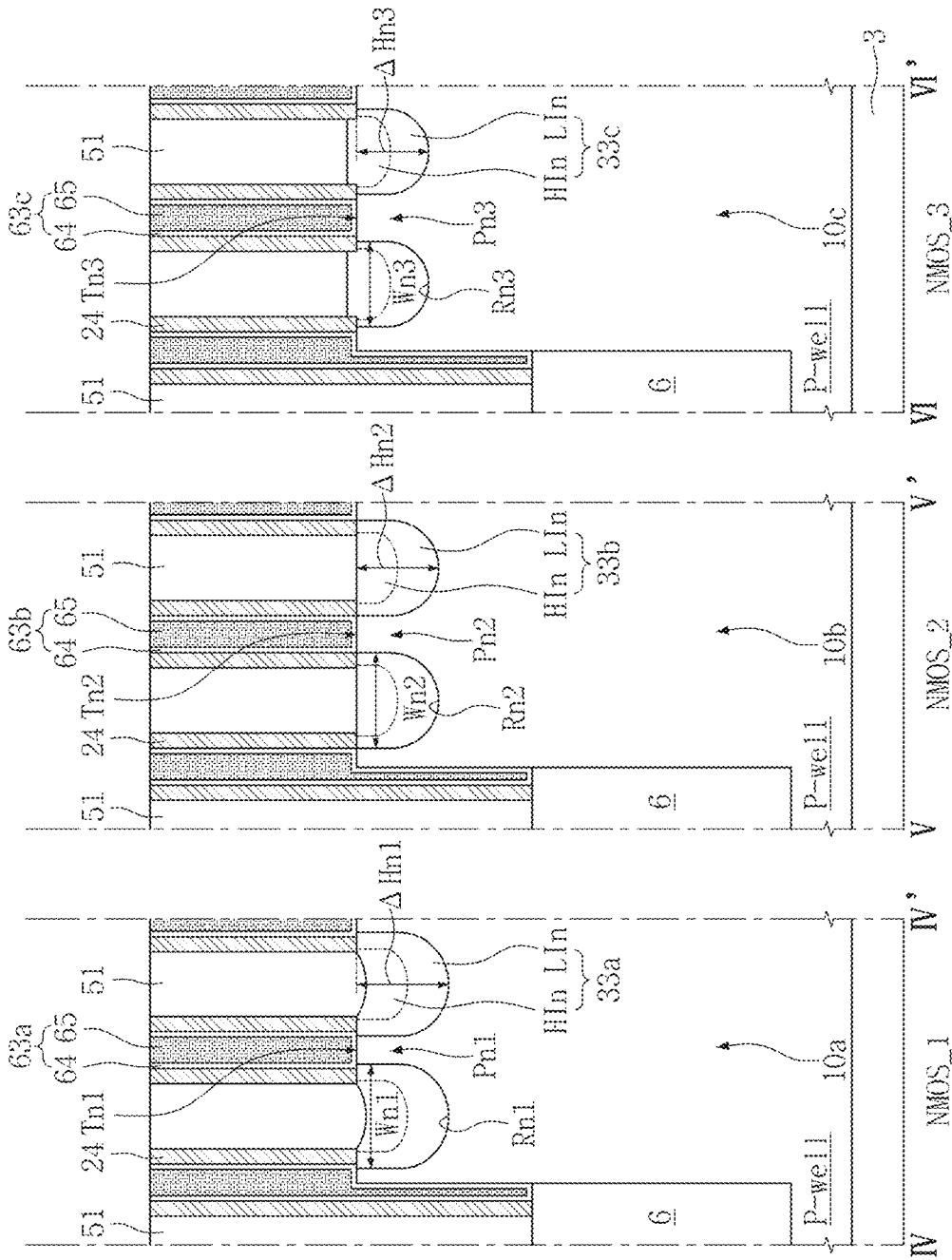

SEMICONDUCTOR DEVICE

CROSS-REFERENCE TO RELATED APPLICATION

This application claims priority under 35 U.S.C. §119 to Korean Patent Application No. 10-2015-0052494 filed on Apr. 14, 2015, the disclosure of which is incorporated by reference in its entirety herein.

BACKGROUND

Technical Field

Embodiments of the inventive concept relate to a semiconductor device and an electronic system including the same.

Discussion of Related Art

A FinFET describes a nonplanar, double-gate transistor built on a silicon on insulator substrate. The conducting channel of a FinFET transistor is wrapped by a thin silicon "fin", which forms the body of the device. As semiconductor devices are highly integrated, discrete devices, such as FinFET transistors, are being used in integrated circuits of the semiconductor devices. Carrier mobility in a FinFET transistor may be increased by forming epitaxial layers at both sides of a channel area of the conductive channel.

SUMMARY

In accordance with an exemplary embodiment of the inventive concept, a semiconductor device is provided. The semiconductor device includes a semiconductor substrate having a first transistor area and a second transistor area. The first transistor area includes a first active region disposed on the semiconductor substrate and including first fin protrusions and a first recessed area disposed between the first fin protrusions, first gate structures disposed on the first fin protrusions, and a first semiconductor layer disposed in the first recessed area. The second transistor area includes a second active region disposed on the semiconductor substrate, including second fin protrusions and a second recessed area disposed between the second fin protrusions, and having the same conductivity type as the first active region, second gate structures disposed on the second fin protrusions, and a second semiconductor layer disposed in the second recessed area. A distance between the first gate structures is the same as a distance between the second gate structures, and a height difference between a top surface of each of the second fin protrusions and a bottom surface of the second recessed area is greater than a height difference between a top surface of each of the first fin protrusions and a bottom surface of the first recessed area.

In an embodiment, a top surface of the first semiconductor layer may be higher than a top surface of the second semiconductor layer.

In an embodiment, the second semiconductor layer may have a greater width than the first semiconductor layer.

In an embodiment, a density of the first transistor area may be greater than a density of the second transistor area.

In an embodiment, the first and second semiconductor layers may be epitaxial layers formed of the same material.

In an embodiment, the first and second semiconductor layers may have different conductivity types from the first and second active regions, respectively.

In an embodiment, each of the first and second semiconductor layers may include a low-concentration impurity area and a high-concentration impurity area disposed on the low-concentration impurity area.

In an embodiment, each of the first fin protrusions may include a top surface facing each of the first gate structures and two side surfaces facing each of the first gate structures and opposite to each other, and each of the second fin protrusions may include a top surface facing each of the second gate structures and two side surfaces facing each of the second gate structures and opposite to each other.

In accordance with an embodiment of the inventive concept, a semiconductor device is provided. The semiconductor device includes an isolation region disposed on a semiconductor substrate and defining first and second active regions having a first conductivity type. The first active region includes a plurality of first fin protrusions and a first recessed area disposed between the first fin protrusions, and the second active region includes a plurality of second fin protrusions and a second recessed area disposed between the second fin protrusions. A plurality of first gate structures are disposed on the plurality of first fin protrusions, and a plurality of second gate structures are disposed on the plurality of second fin protrusions. A first semiconductor layer is disposed in the first recessed area, and a second semiconductor layer is disposed in the second recessed area. A distance between the plurality of first gate structures is the same as a distance between the plurality of second gate structures, and a height difference between a bottom surface of the first semiconductor layer and a top surface of each of the first fin protrusions is smaller than a height difference between a bottom surface of the second semiconductor layer and a top surface of each of the second fin protrusions.

In an embodiment, the semiconductor device may further include a first transistor area disposed in the semiconductor substrate, and a second transistor area disposed in the semiconductor substrate. In the embodiment, the first active region, the first gate structures, and the first semiconductor layer may be disposed in the first transistor area, and the second active region, the second gate structures, and the second semiconductor layer may be disposed in the second transistor area. Further, in the embodiment, a density of the first transistor area may be greater than a density of the second transistor area.

In an embodiment, a top surface of the first semiconductor layer may be disposed between the first gate structures.

In accordance with an embodiment of the inventive concept, a semiconductor device is provided. The semiconductor device includes a semiconductor substrate including a first area and a second area. A first PMOS transistor area is disposed in the first area of the semiconductor substrate, and a second PMOS transistor area is disposed in the second area of the semiconductor substrate. The first PMOS transistor area includes first PMOS gate structures overlapping first PMOS fin protrusions of a first PMOS active region disposed on the semiconductor substrate, and a first PMOS semiconductor layer disposed in a first PMOS recessed area between the first PMOS fin protrusions. The second PMOS transistor area includes second PMOS gate structures overlapping second PMOS fin protrusions of a second PMOS active region disposed on the semiconductor substrate, and a second PMOS semiconductor layer disposed in a second PMOS recessed area between the second PMOS fin protrusions. A distance between the first PMOS gate structures is the same as a distance between the second PMOS gate structures, and the second PMOS recessed area is deeper than the first PMOS recessed area.

In an embodiment, a density of the first PMOS transistor areas in the first area may be greater than a density of the second PMOS transistor areas in the second area.

In an embodiment, a top surface of the first PMOS semiconductor layer may be higher than a top surface of the second PMOS semiconductor layer.

In an embodiment, the semiconductor device may further include a third PMOS transistor area disposed in a third area of the semiconductor substrate. In this embodiment, the third PMOS transistor area may include third PMOS gate structures overlapping third PMOS fin protrusions of a third PMOS active region disposed on the semiconductor substrate, and a third PMOS semiconductor layer disposed in a third PMOS recessed area between the third PMOS fin protrusions.

In an embodiment, a distance between the third PMOS gate structures may be the same as the distance between the first PMOS gate structures, and the third PMOS recessed area may be deeper than the second PMOS recessed area.

In an embodiment, the semiconductor device may further include a first NMOS transistor area disposed in the first area of the semiconductor substrate, and a second NMOS transistor area disposed in the second area of the semiconductor substrate. In this embodiment, the first NMOS transistor area may include first NMOS gate structures overlapping first NMOS fin protrusions of a first NMOS active region disposed on the semiconductor substrate, and a first NMOS semiconductor layer disposed in a first NMOS recessed area between the first NMOS fin protrusions. In this embodiment, the second NMOS transistor area may include second NMOS gate structures overlapping second NMOS fin protrusions of a second NMOS active region disposed on the semiconductor substrate, and a second NMOS semiconductor layer disposed in a second NMOS recessed area between the second NMOS fin protrusions. In this embodiment, a distance between the first NMOS gate structures may be the same as a distance between the second NMOS gate structures, and the first NMOS recessed area may be deeper than the second NMOS recessed area.

In an embodiment, a density of the second NMOS transistor area in the second area may be greater than a density of the first NMOS transistor area in the first area.

In an embodiment, the first and second PMOS recessed areas may be deeper than the first and second NMOS recessed areas.

In an embodiment, the semiconductor device may further include a third NMOS transistor area disposed in the third area of the semiconductor substrate. In this embodiment, the third NMOS transistor area may include third NMOS gate structures overlapping third NMOS fin protrusions of a third NMOS active region disposed on the semiconductor substrate, and a third NMOS semiconductor layer disposed in a third NMOS recessed area between the third NMOS fin protrusions. In this embodiment, a density of the third NMOS transistor area disposed in the third area may be greater than a density of the second NMOS transistor area disposed in the second area, and the second NMOS recessed area may be deeper than the third NMOS recessed area.

In accordance with an exemplary embodiment of the inventive concept, a semiconductor device is provided. The semiconductor device includes an isolation region disposed on a semiconductor substrate and defining first and second active regions. The first active region includes first fin protrusions and a first recessed area disposed between the first fin protrusions, and the second active region includes a second fin protrusions and a second recessed area disposed between the second fin protrusions. First gate structures parallel to each other are disposed on the first fin protrusions, and second gate structures parallel to each other are disposed on the second fin protrusions. A first semiconductor layer is disposed in the first recessed area, and a second semiconductor layer is disposed in the second recessed area. A distance between the first gate structures is the same as a distance between the second gate structures, and the first and second recessed areas have different depths or different widths.

In an embodiment, the semiconductor device may further include at least one first transistor area disposed in a first area of the semiconductor substrate and at least one second transistor area disposed in a second area of the semiconductor substrate. The first active region, the first gate structures, and the first semiconductor layers may be disposed in the first transistor area, and the second active region, the second gate structures, and the second semiconductor layers may be disposed in the second transistor area, and a density of the first transistor area disposed in the first area may be greater than a density of the second transistor area disposed in the second area.

In an embodiment, the second recessed area may be deeper than the first recessed area.

In an embodiment, each of the first and second gate structures may include a gate electrode and a gate dielectric disposed on bottom and side surfaces of the gate electrode.

In an embodiment, the first gate structures may have a line shape overlapping the first fin protrusions and extending onto the isolation region, and the second gate structures may have a line shape overlapping the second protrusions and extending onto the isolation region.

According to an exemplary embodiment of the inventive concept, a semiconductor device is provided that includes: a semiconductor substrate; a first active region disposed on the semiconductor substrate, and including first protrusions and a first recessed area disposed between the first protrusions; first gate structures disposed on the first protrusions; a first semiconductor layer disposed in the first recessed area; a second active region disposed on the semiconductor substrate, and including second protrusions and a second recessed area disposed between the second protrusions, and having the same conductivity type as the first active region; second gate structures disposed on the second protrusions; and a second semiconductor layer disposed in the second recessed area. In this embodiment, a distance between the first gate structures is the same as a distance between the second gate structures, and a height difference between a top surface of one of the second protrusions and a bottom surface of the second recessed area is greater than a height difference between a top surface of one of the first protrusions and a bottom surface of the first recessed area.

BRIEF DESCRIPTION OF THE DRAWINGS

The inventive concept will become more apparent by describing in detail exemplary embodiments of the inventive concepts thereof with reference to the accompany drawings, in which:

FIGS. 3A, 3B, and 3C are cross-sectional views illustrating a semiconductor device in accordance with an exemplary embodiment of the inventive concept;

FIGS. 4A to 12C are cross-sectional views for describing a method of forming a semiconductor device in accordance with an exemplary embodiment of the inventive concept;

DETAILED DESCRIPTION OF THE EXEMPLARY EMBODIMENTS

Figure 1:
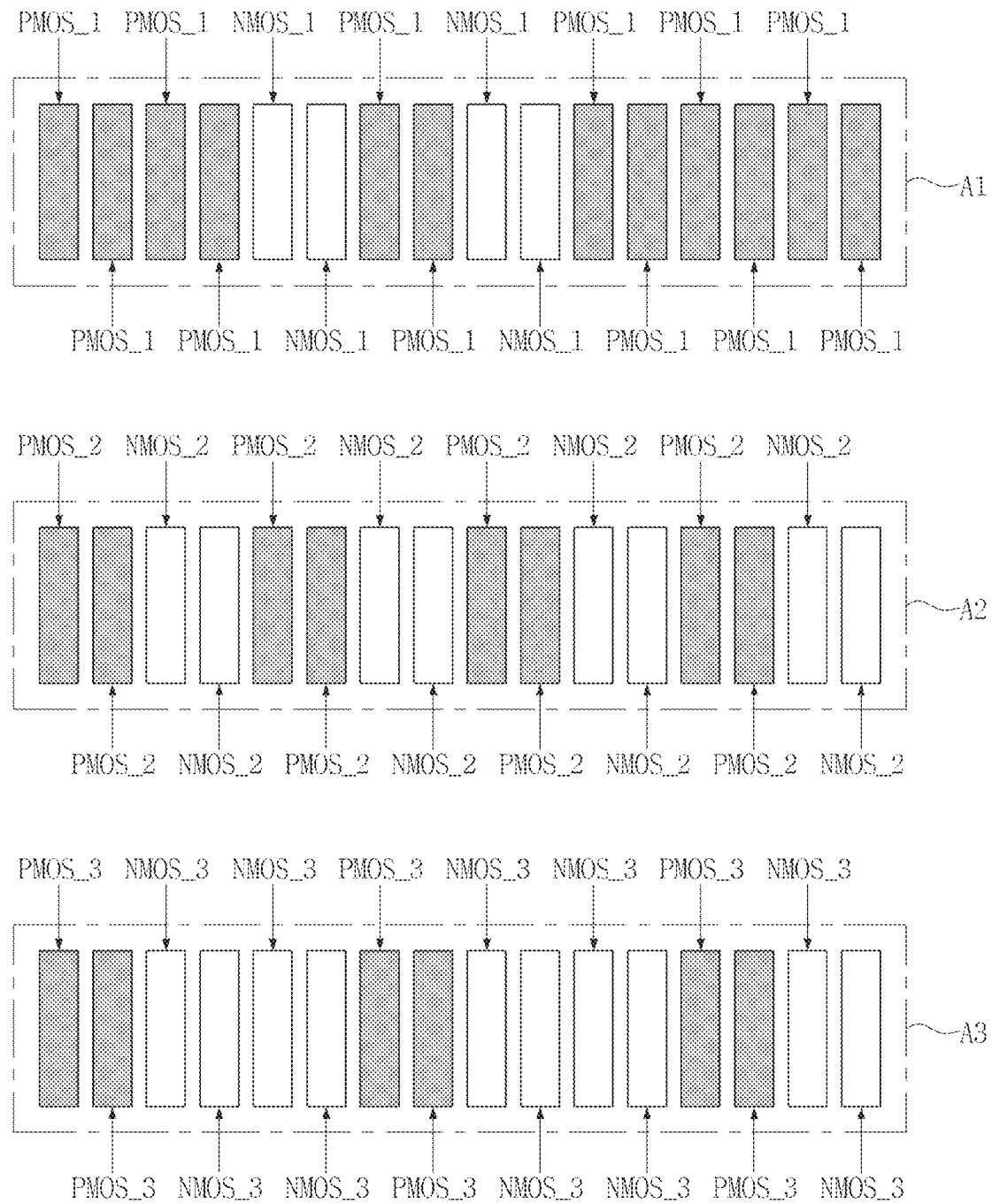
FIG. 1 is a plan view conceptually illustrating a semiconductor device in accordance with an exemplary embodiment of the inventive concept.

Hereinafter, exemplary embodiments of the inventive concept will now be described more fully with reference to the accompanying drawings in which some embodiments are shown. The inventive concept may, however, be embodied in different forms and should not be construed as limited to the exemplary embodiments set forth herein. Rather, these embodiments are provided so that this disclosure fully conveys the inventive concept to those skilled in the art. Accordingly, all such modifications are intended to be included within the scope of the inventive concept. Like numerals refer to like elements throughout the specification.

Embodiments are described herein with reference to cross-sectional views, plan views, and/or block diagrams that are schematic views of idealized embodiments and intermediate structures. As such, variations from the shapes of the illustrations, as a result, for example, of manufacturing techniques and/or tolerances, are to be expected. Thus, embodiments should not be construed as limited to the particular shapes of regions illustrated herein, but are to include deviations in shapes that result, for example, from manufacturing.

In the drawings, the sizes and relative sizes of layers and regions may be exaggerated for clarity. It will be understood that when a layer is referred to as being "on" or "under" another layer or a substrate, the layer may be formed directly on the other layer or the substrate, or an intervening layer may exist between the layer and the other layer or the substrate. Elements in an embodiment of the inventive concept referred to in the singular form may number one or more, unless the context clearly indicates otherwise.

Figure 2:
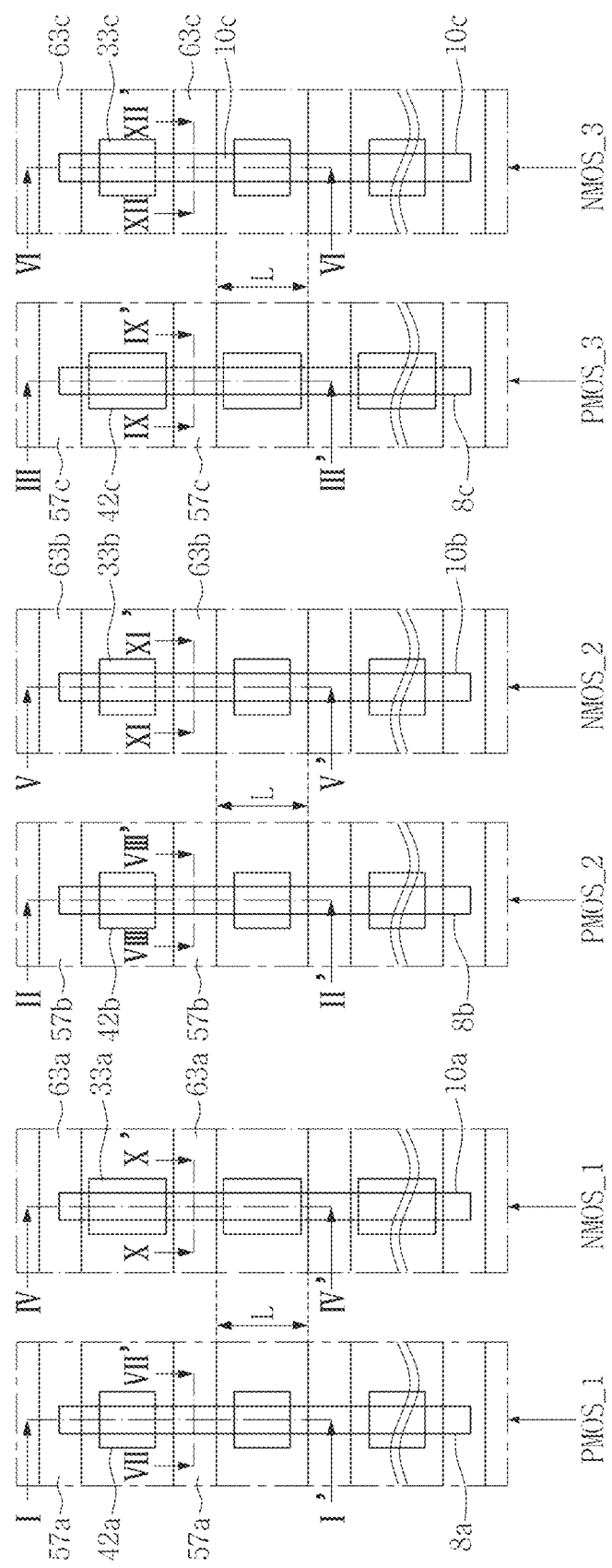
FIG. 2 is a plan view illustrating first to third NMOS transistor areas NMOS_1, NMOS_2, and NMOS_3, and first to third PMOS transistor areas PMOS_1, PMOS_2, and PMOS_3.
Figure 3A:
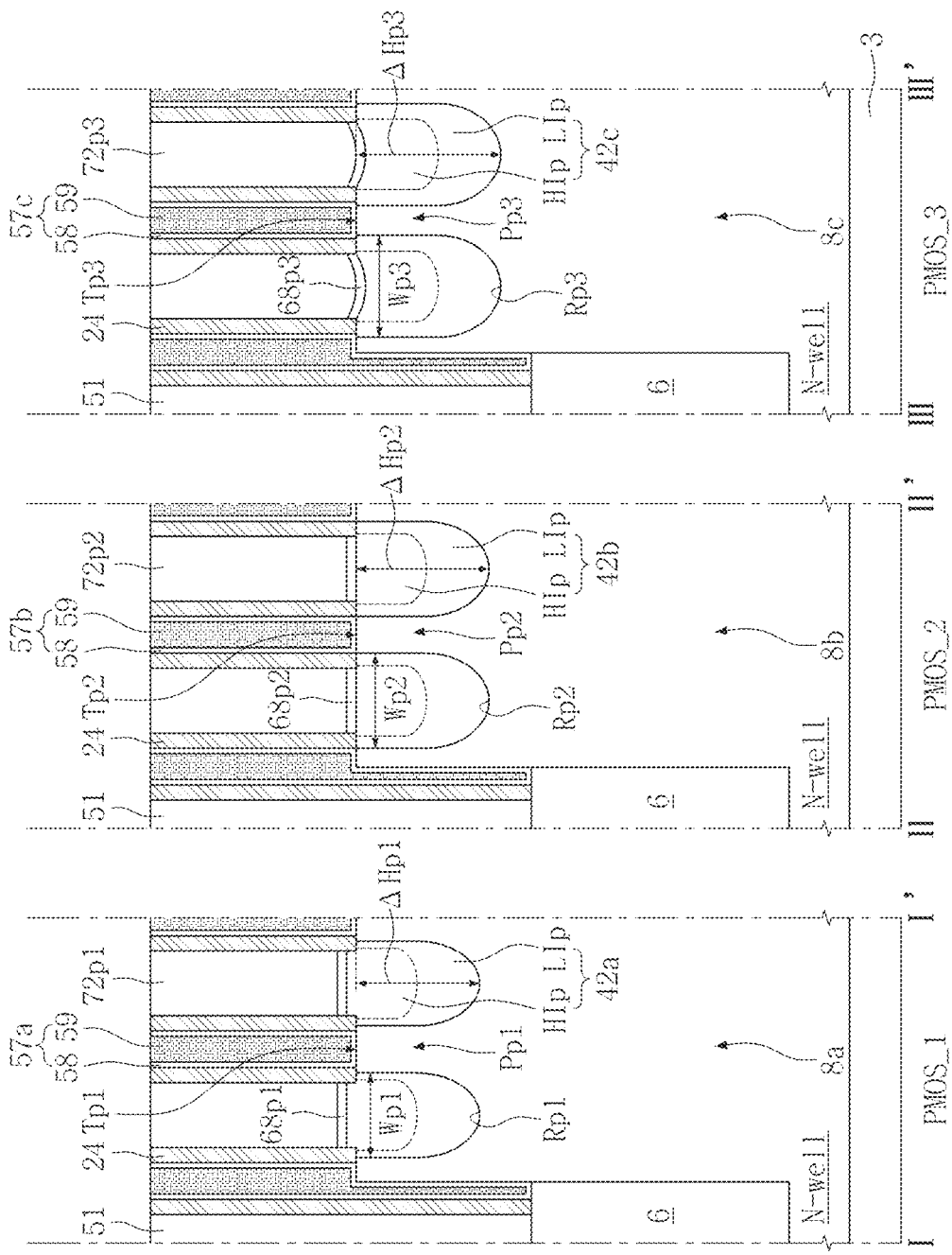
Figure 3B:
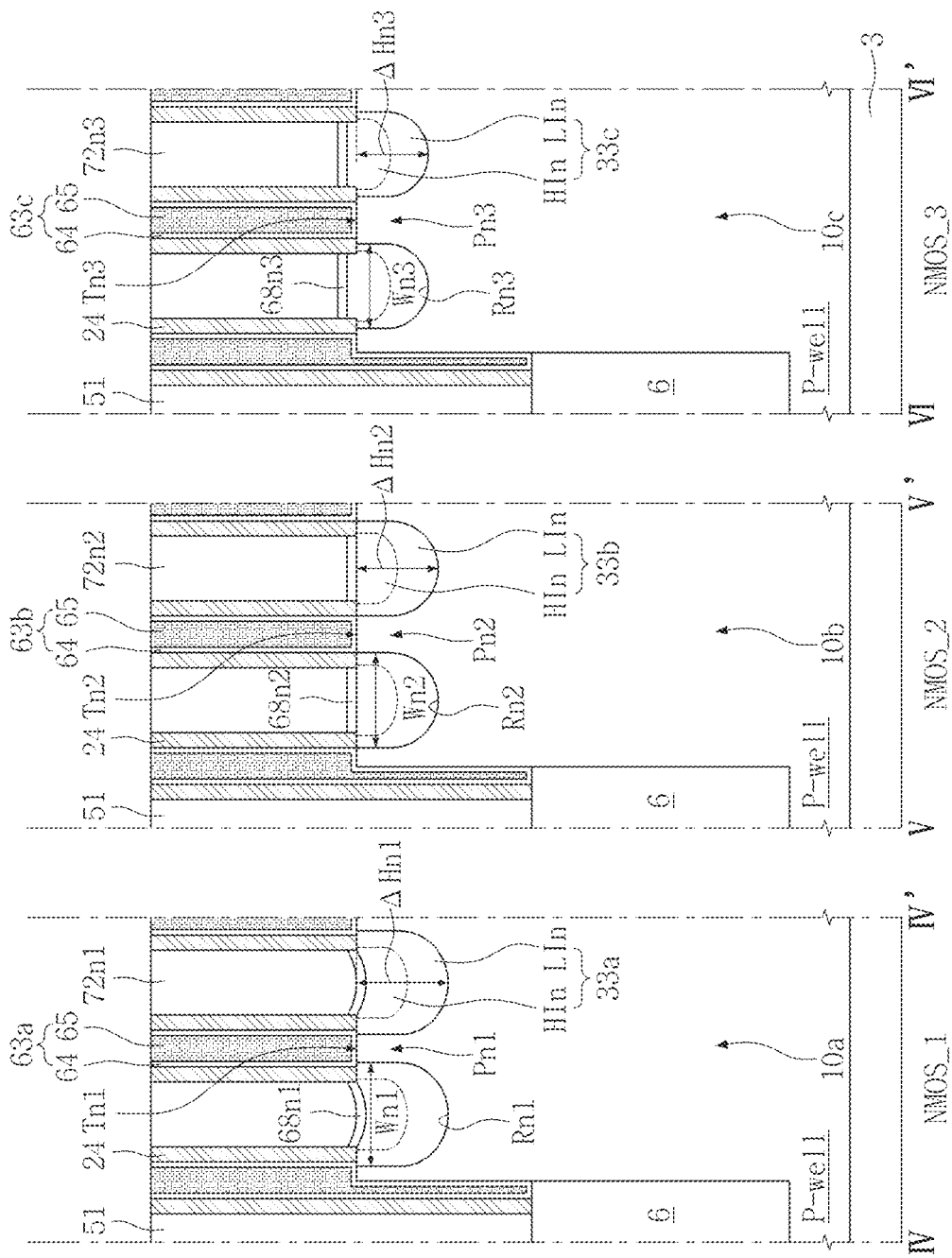
Figure 4C:
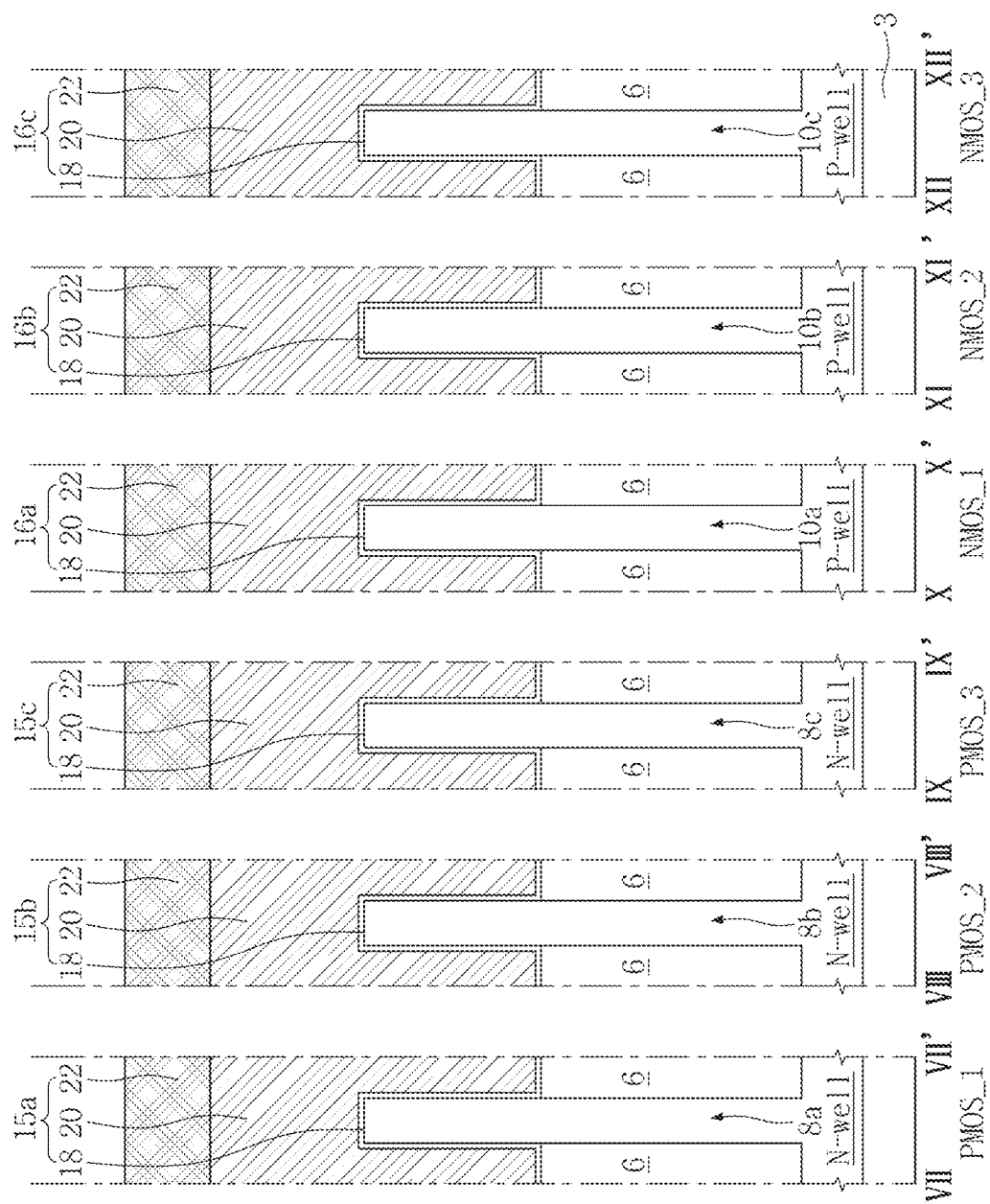
Figure 5B:
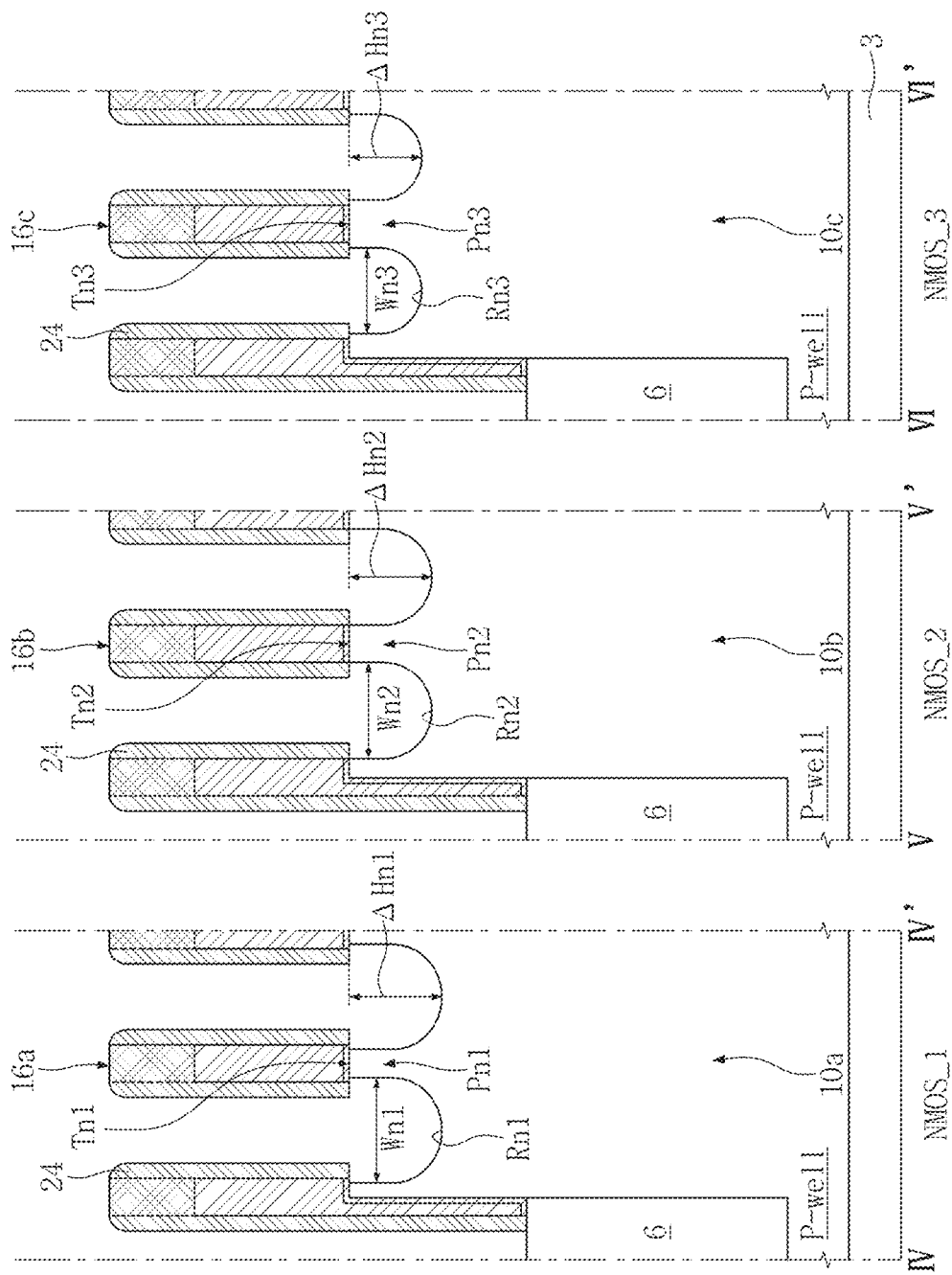
Figure 5C:
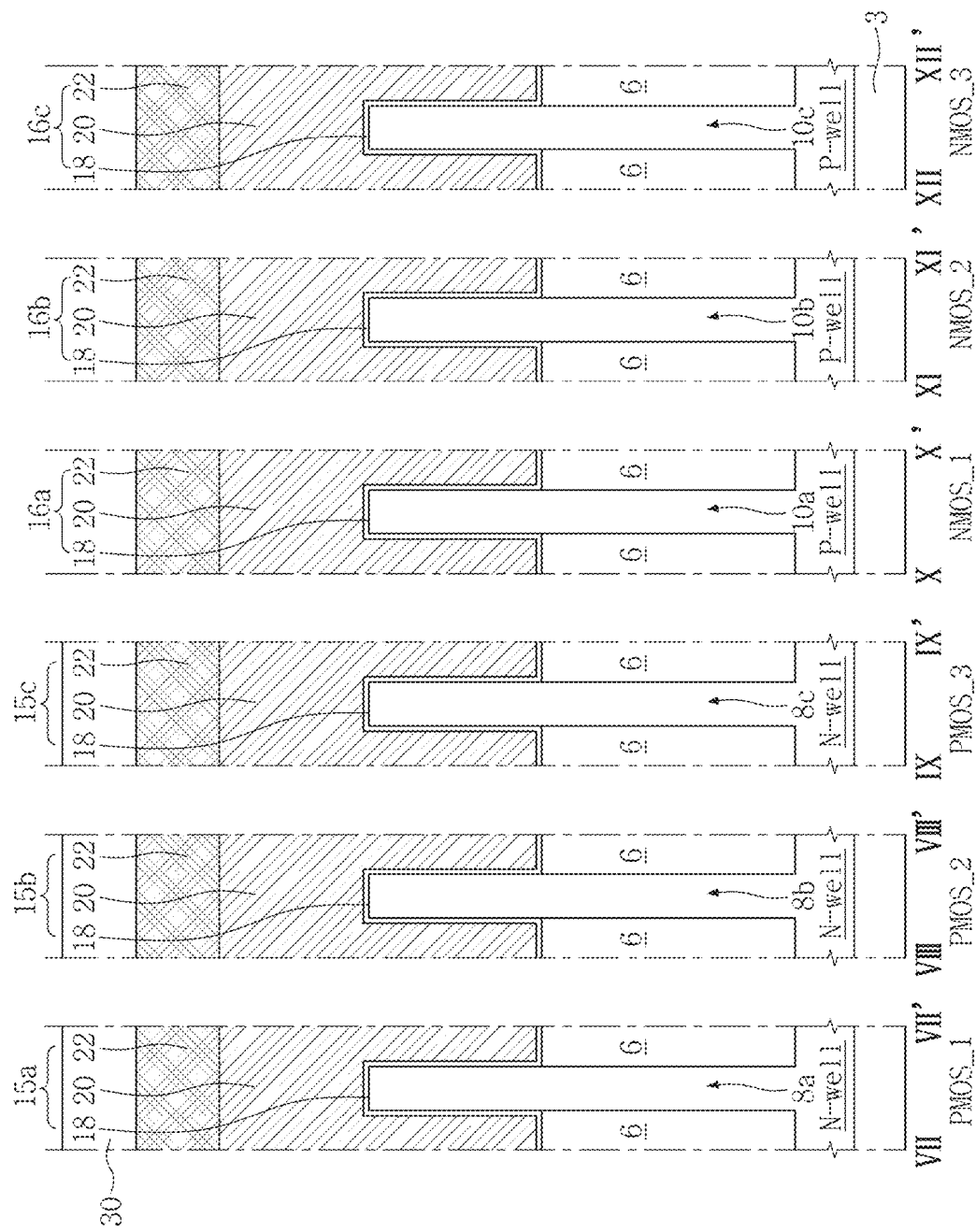
Figure 6B:
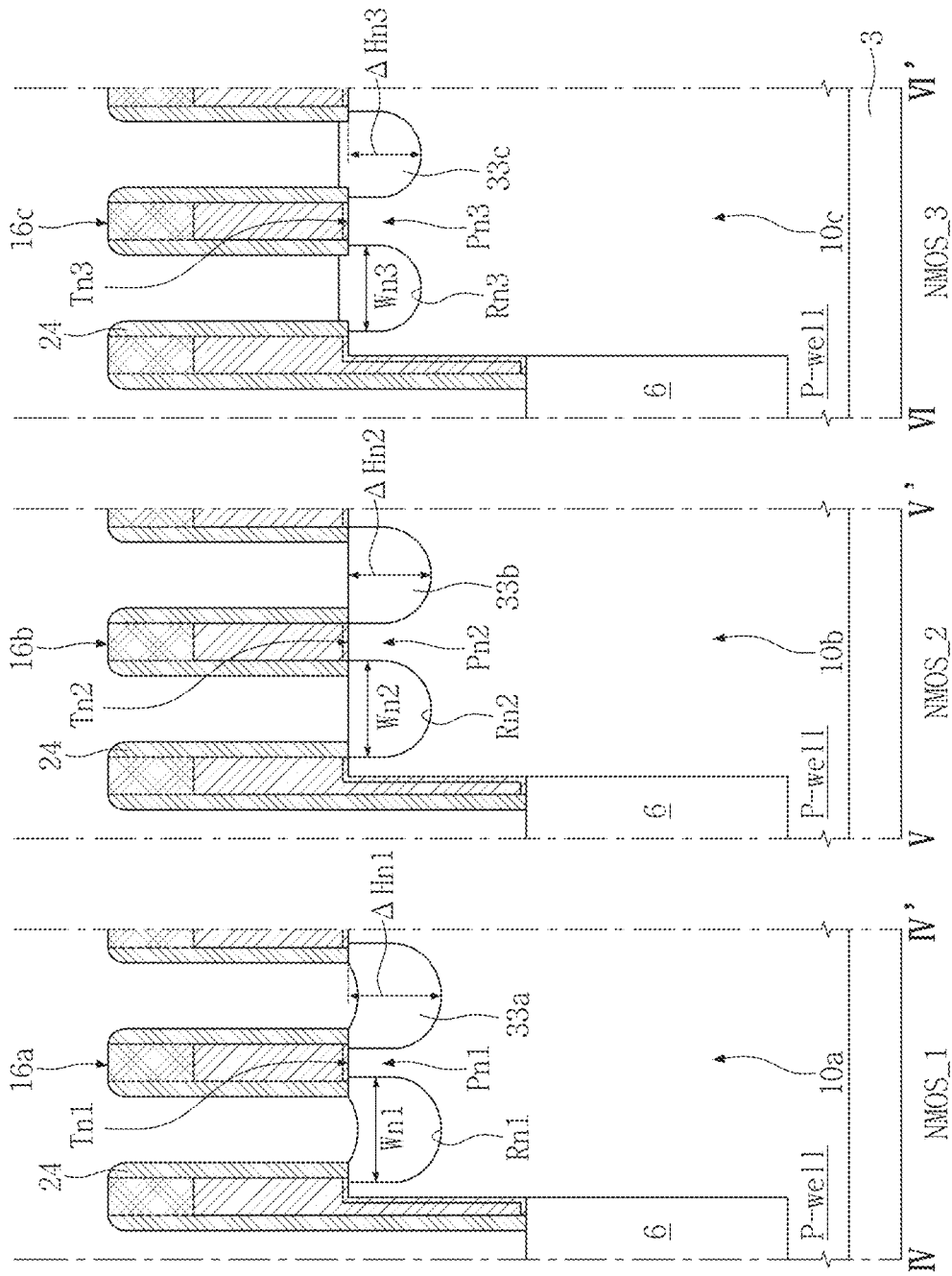
Figure 6C:
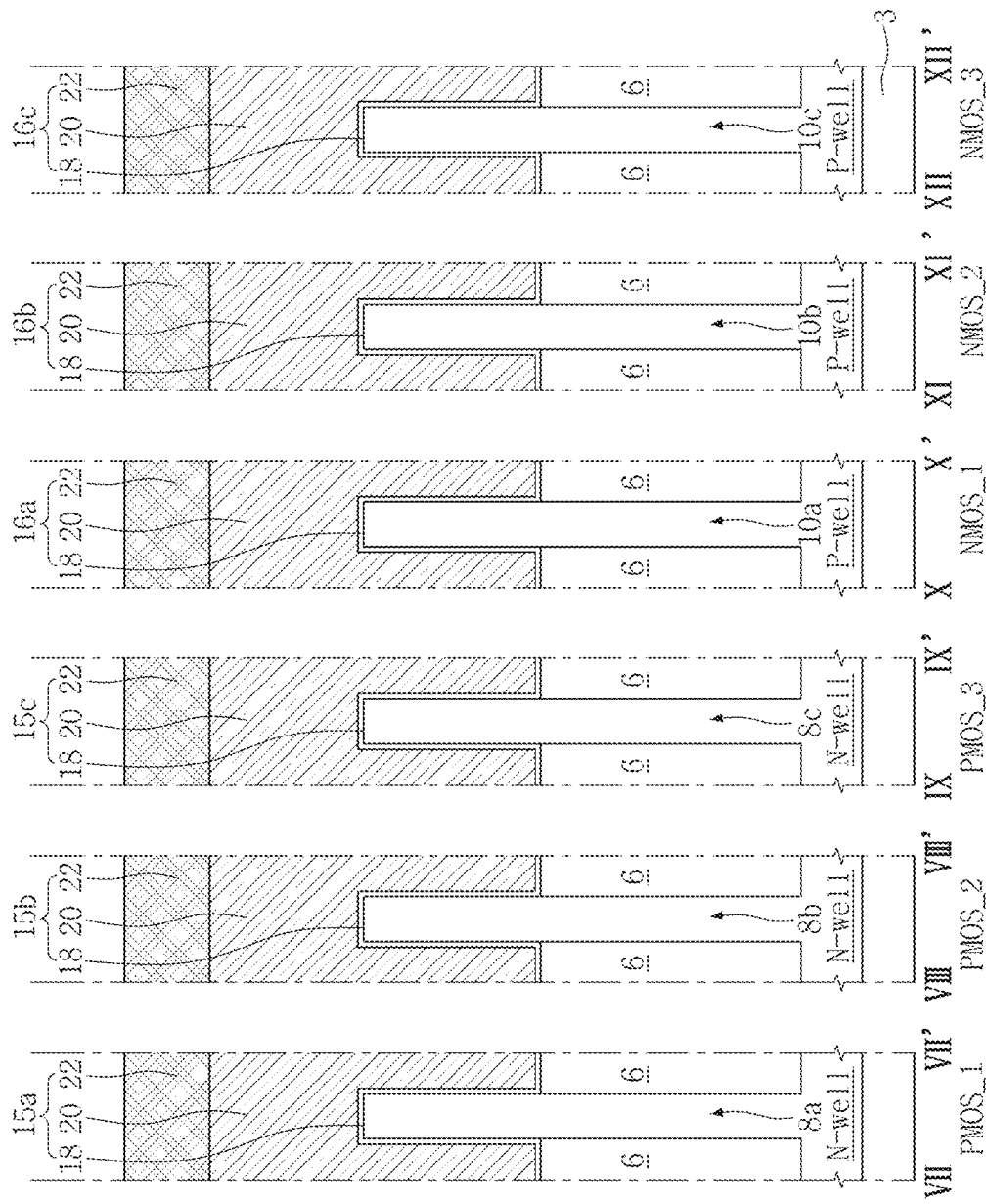
Figure 7A:
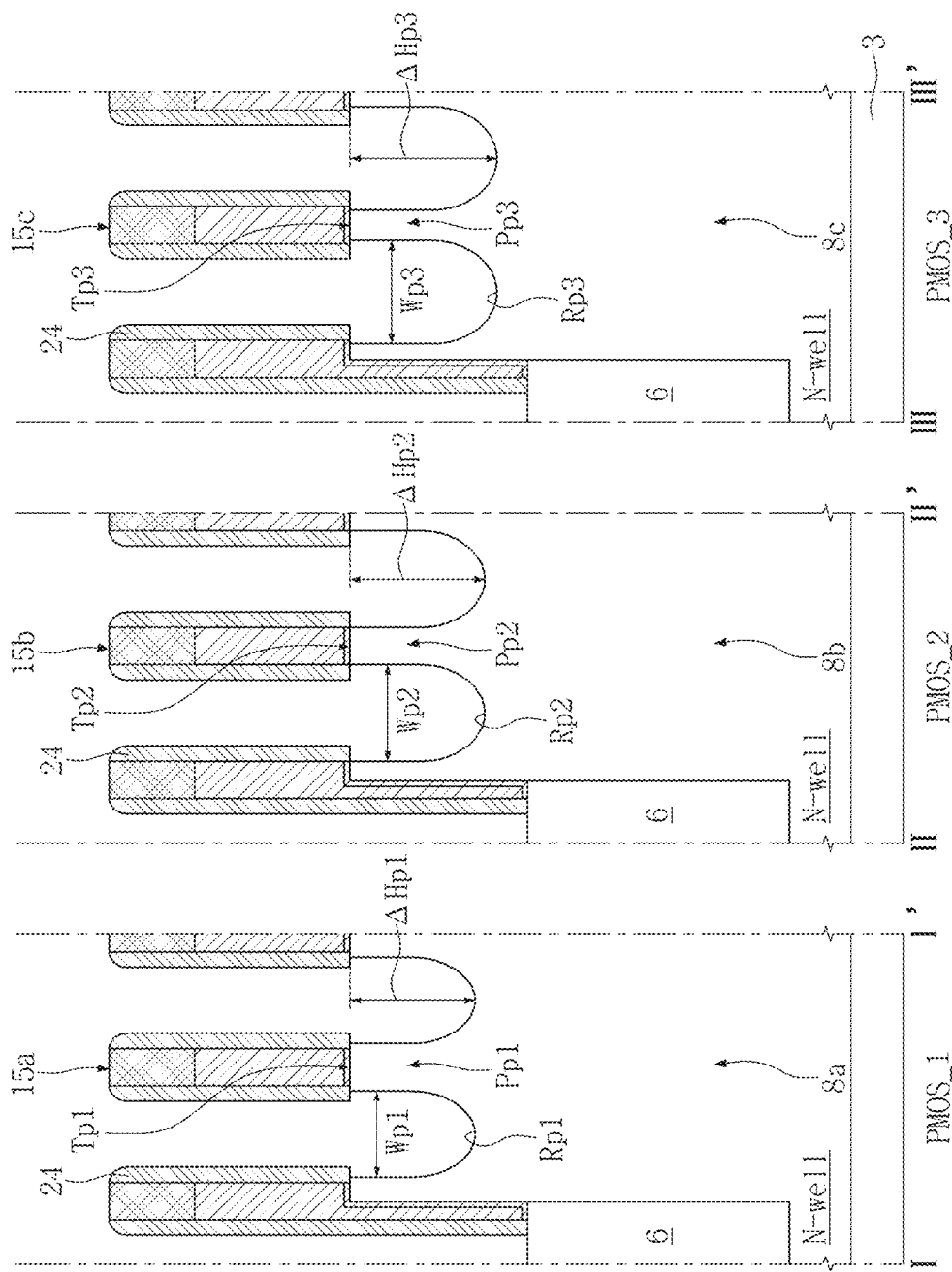
Figure 7B:
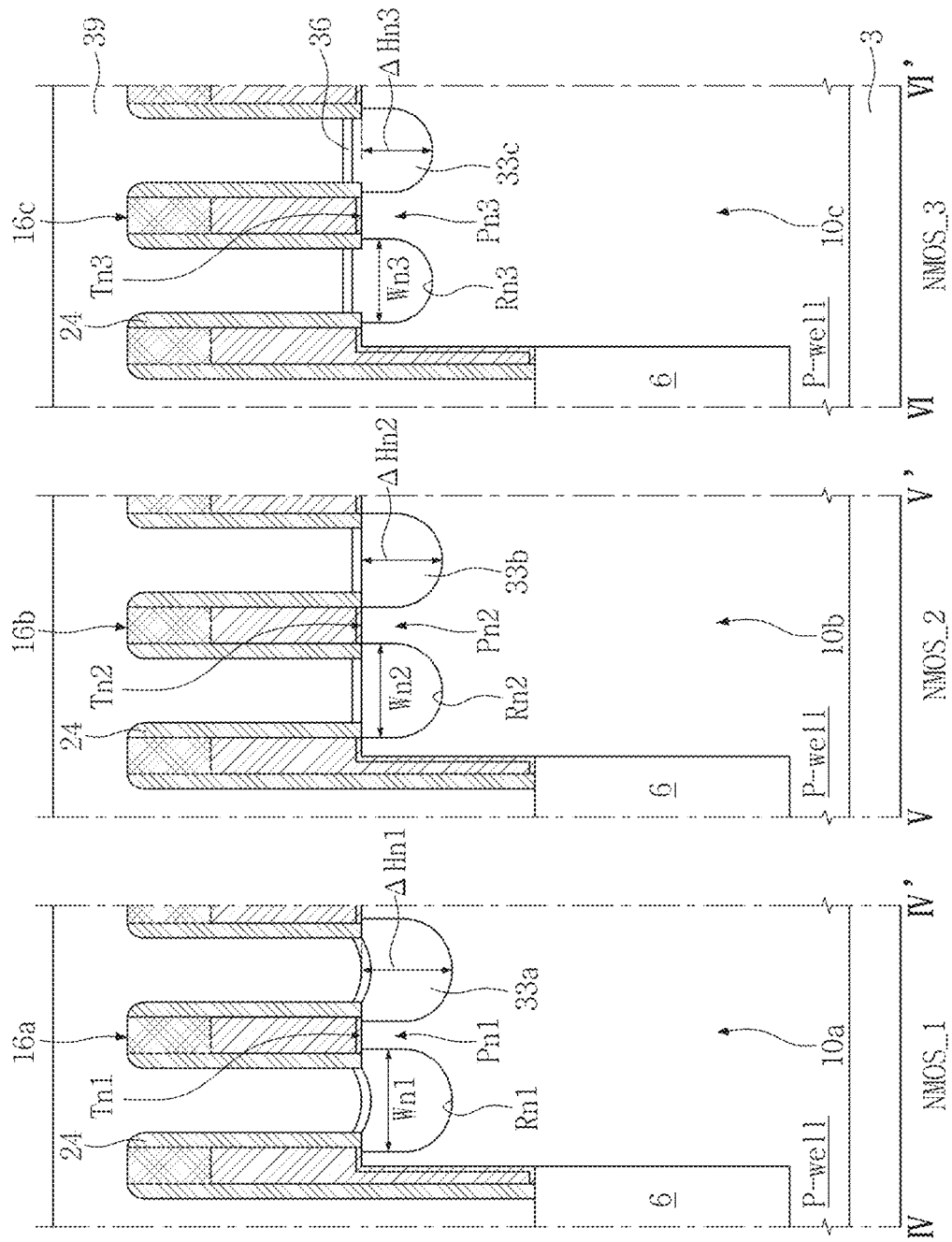
Figure 7C:
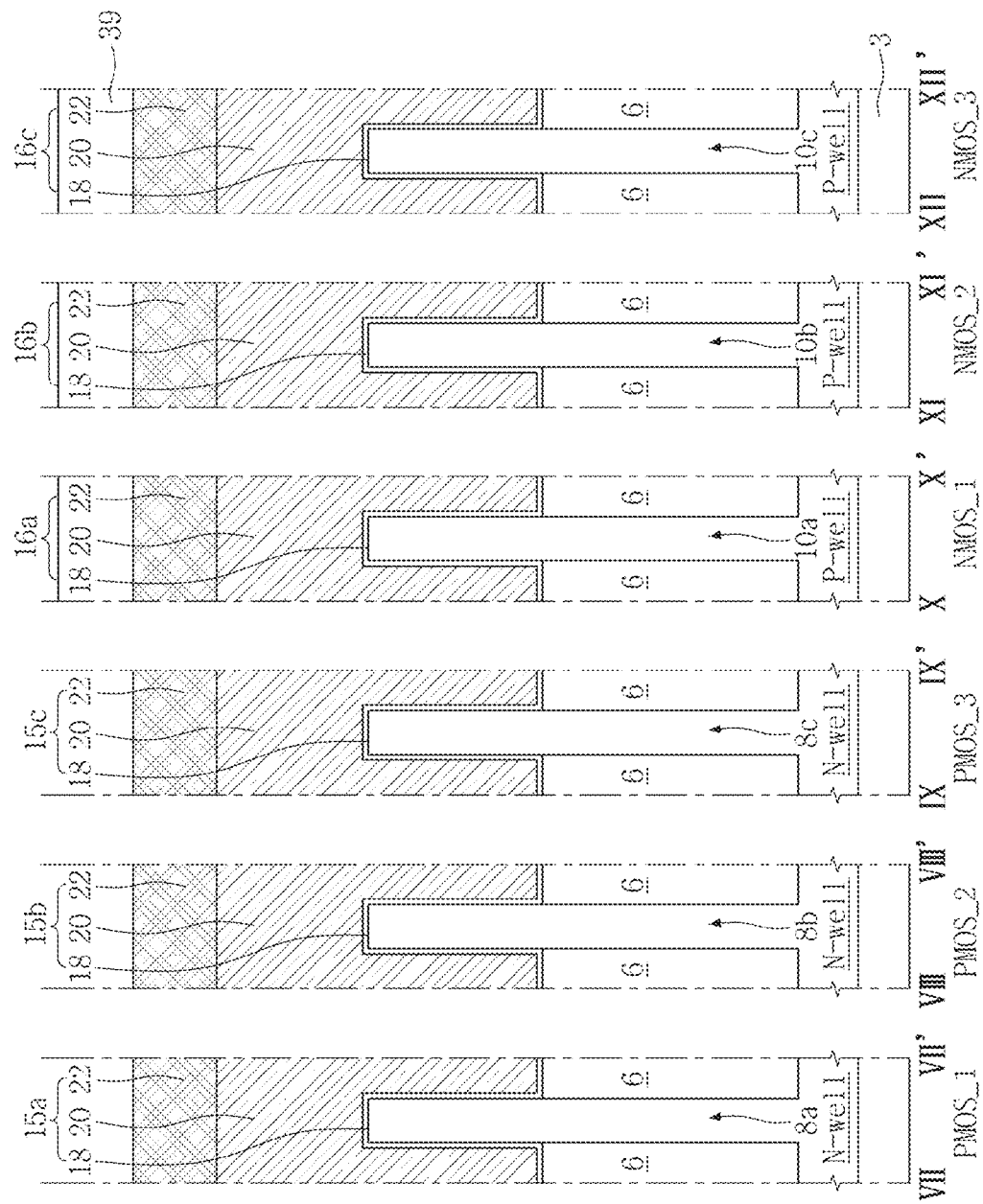
Figure 8A:
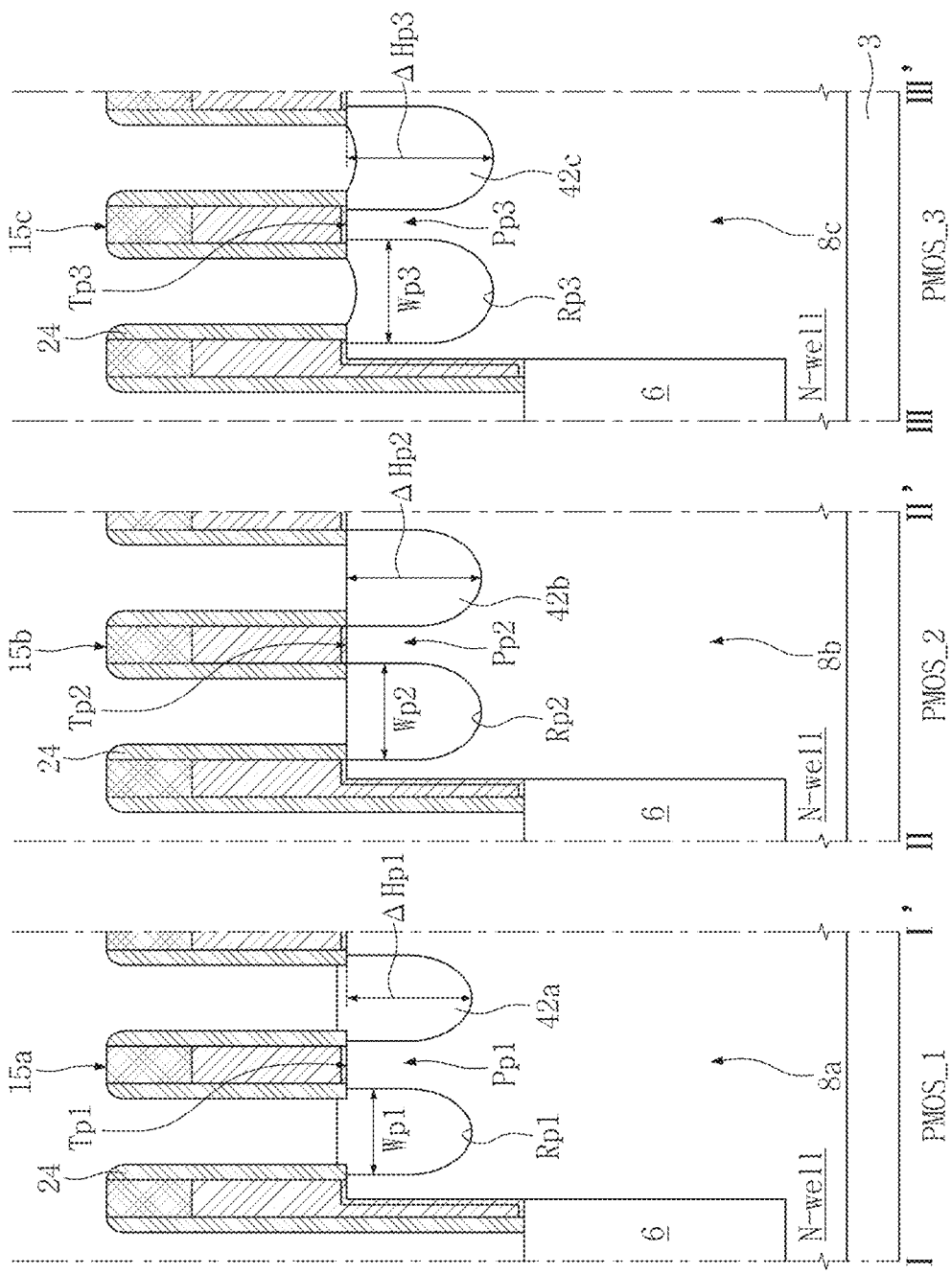
Figure 8B:
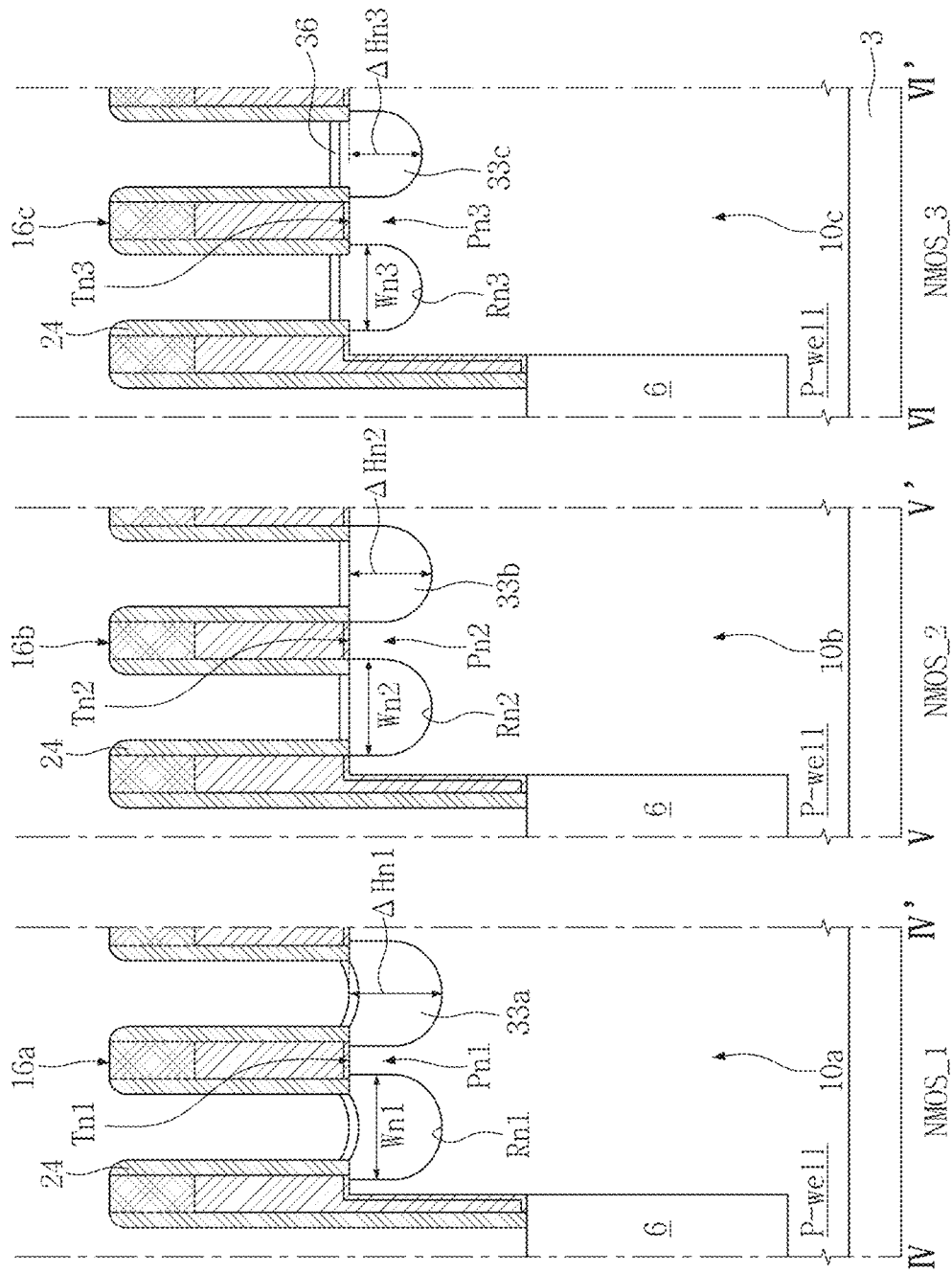
Figure 8C:
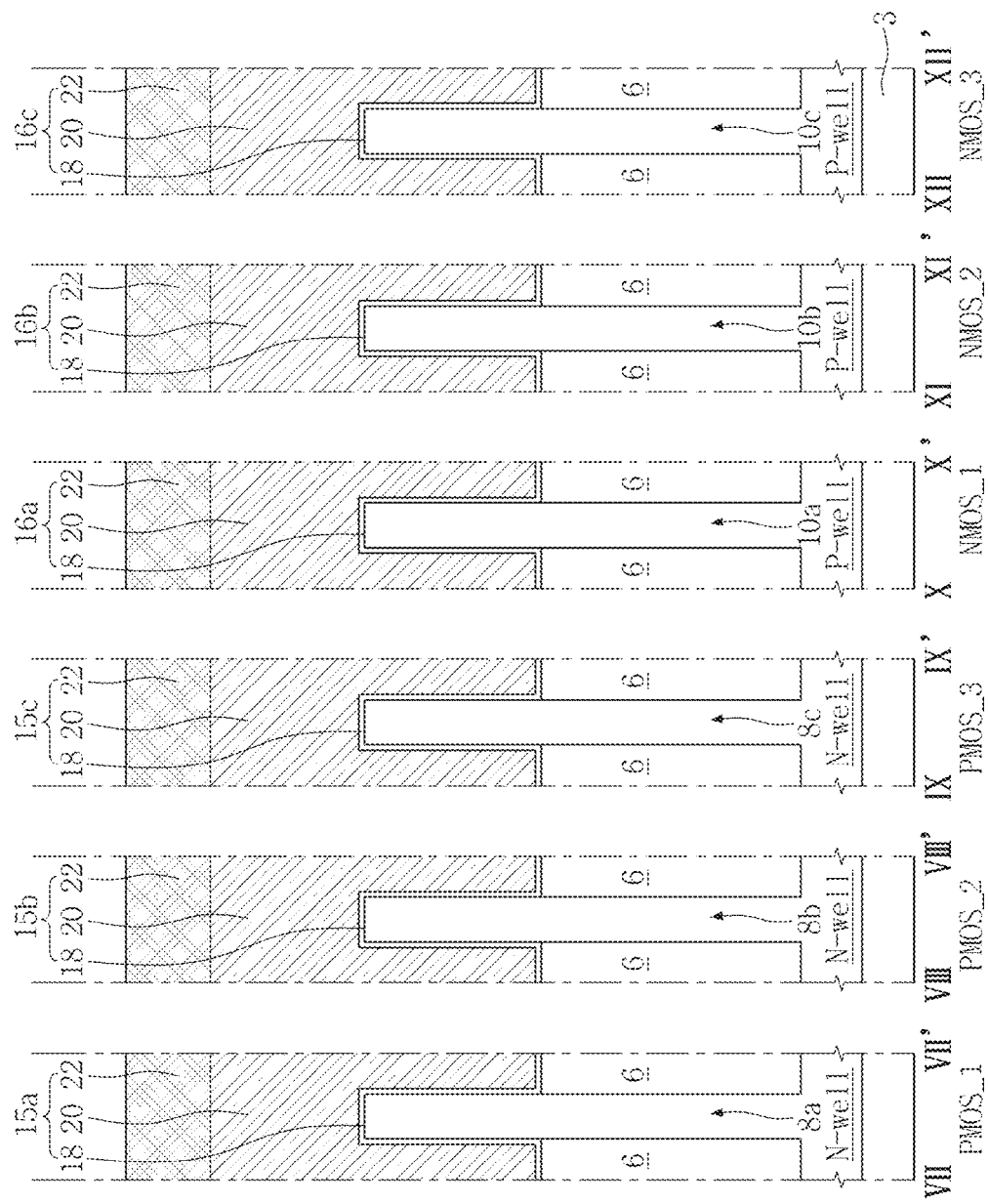
Figure 10A:
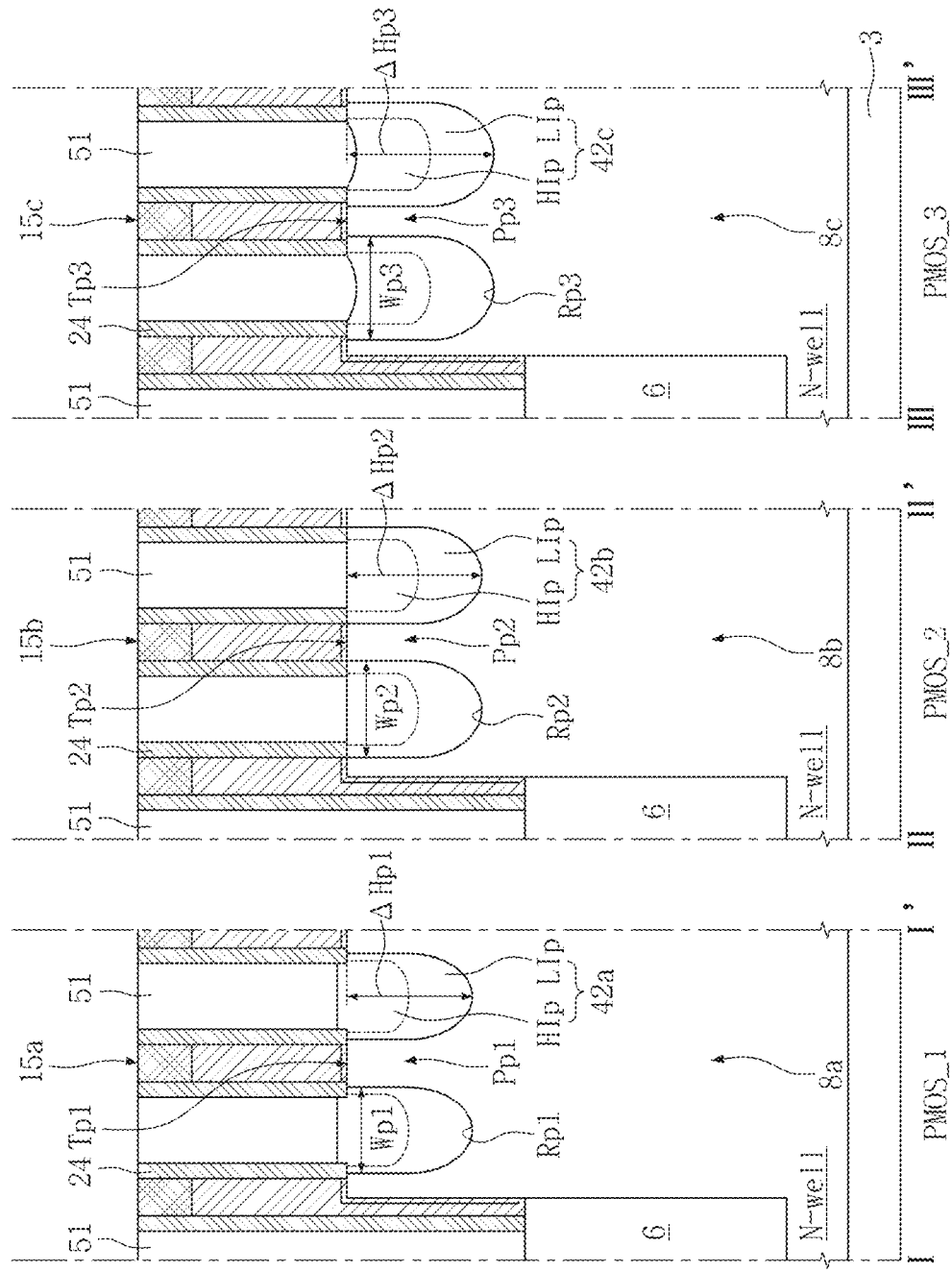
Figure 10C:
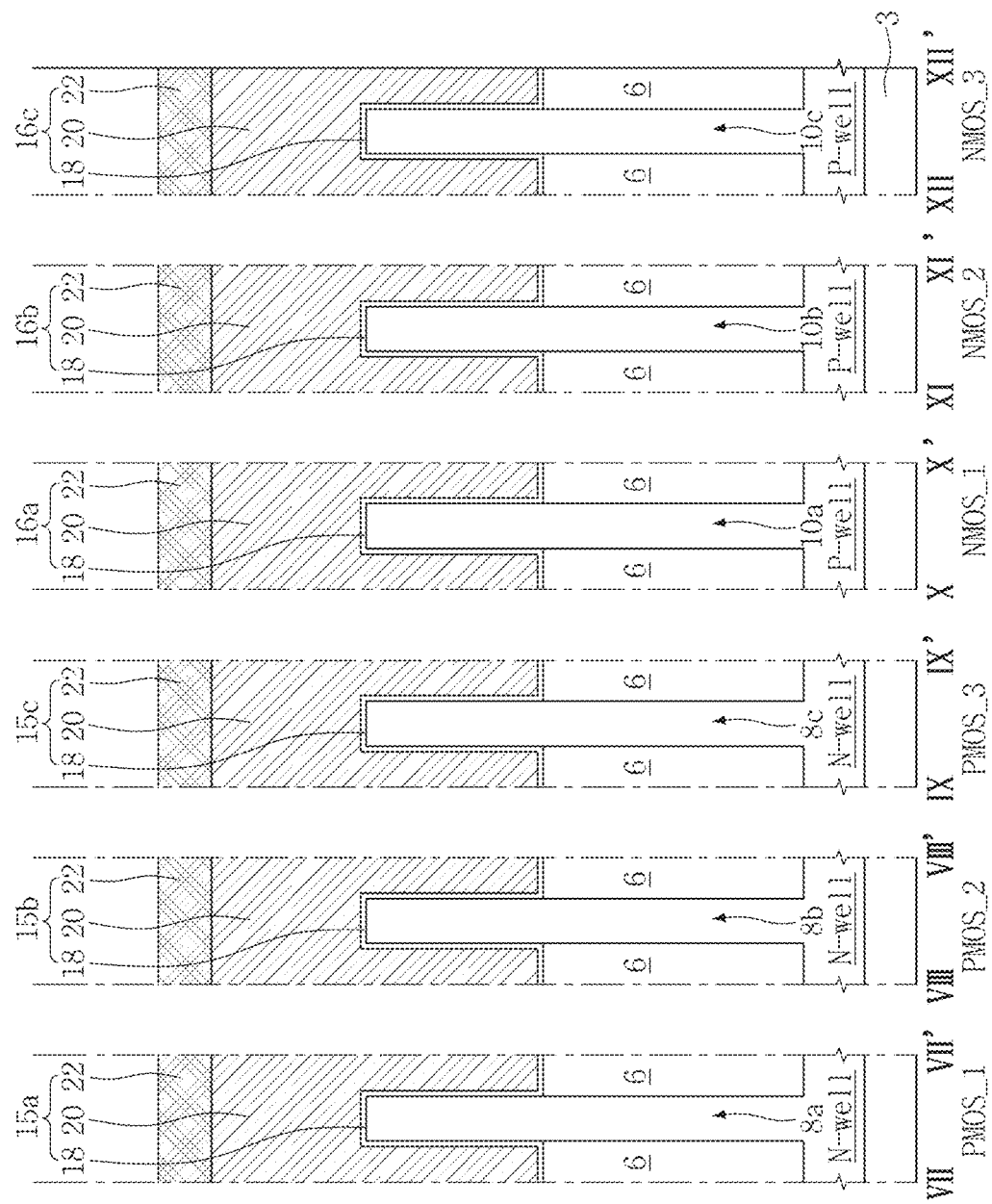
Figure 11A:
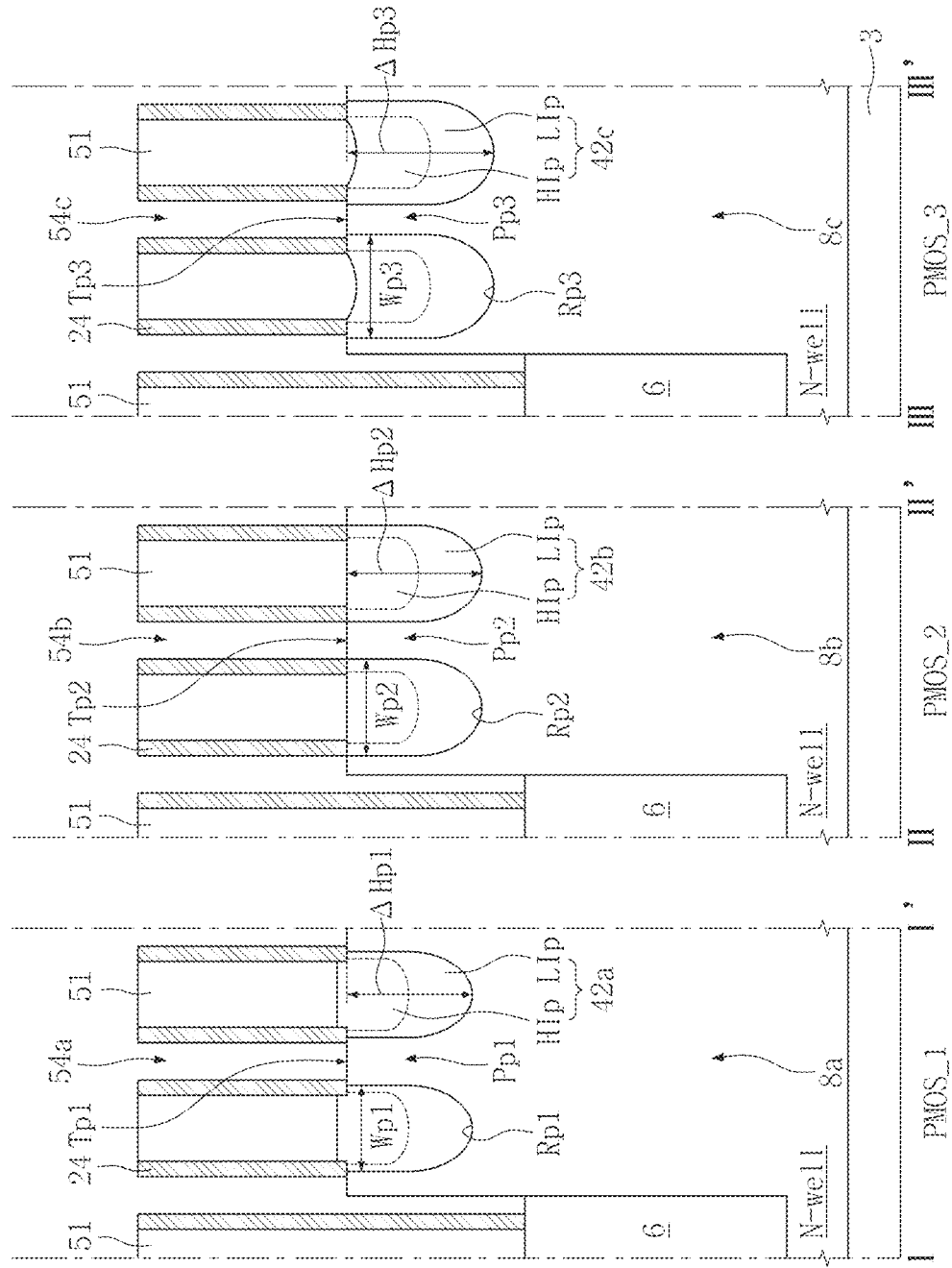
Figure 11B:
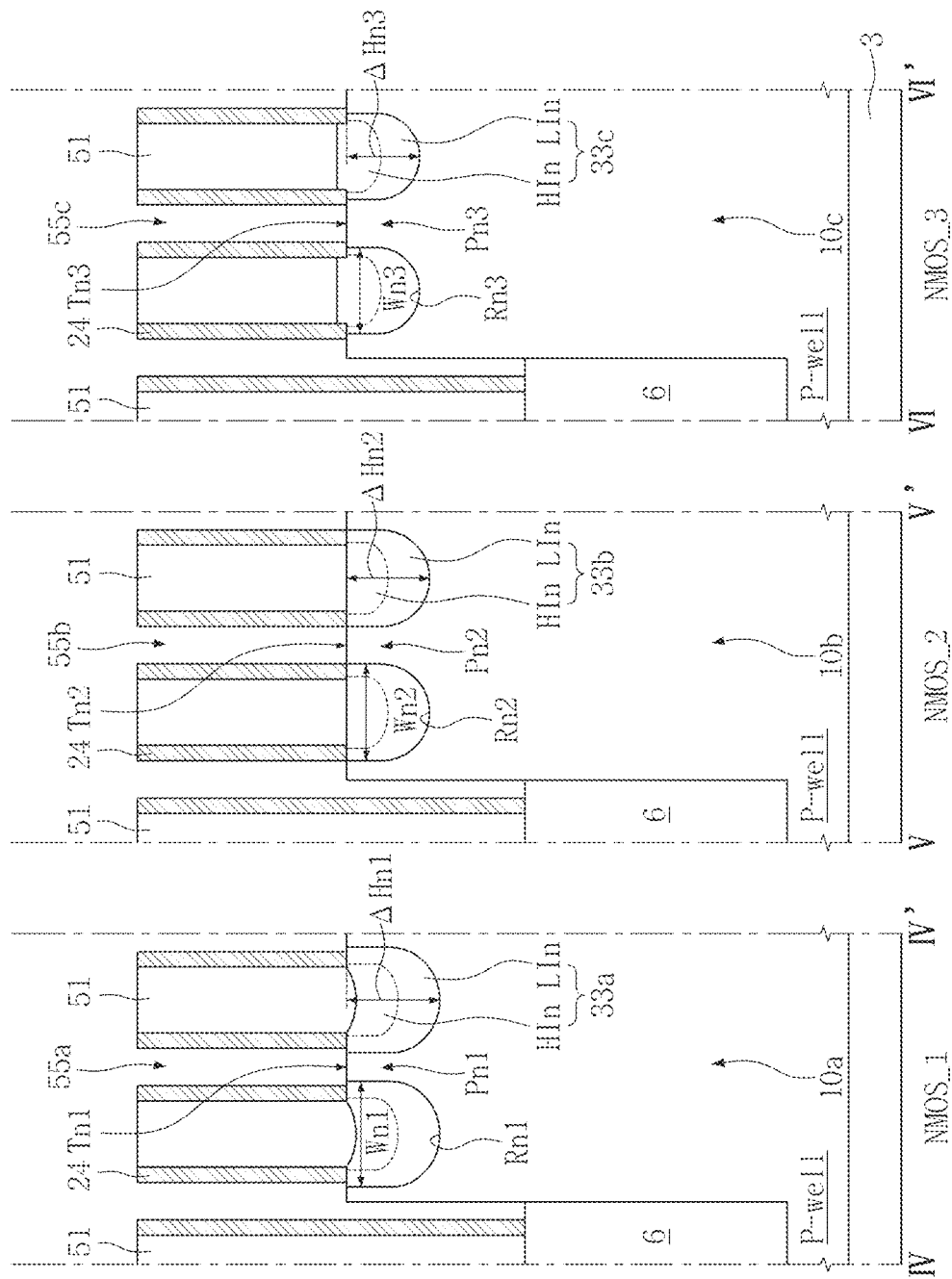
Figure 11C:
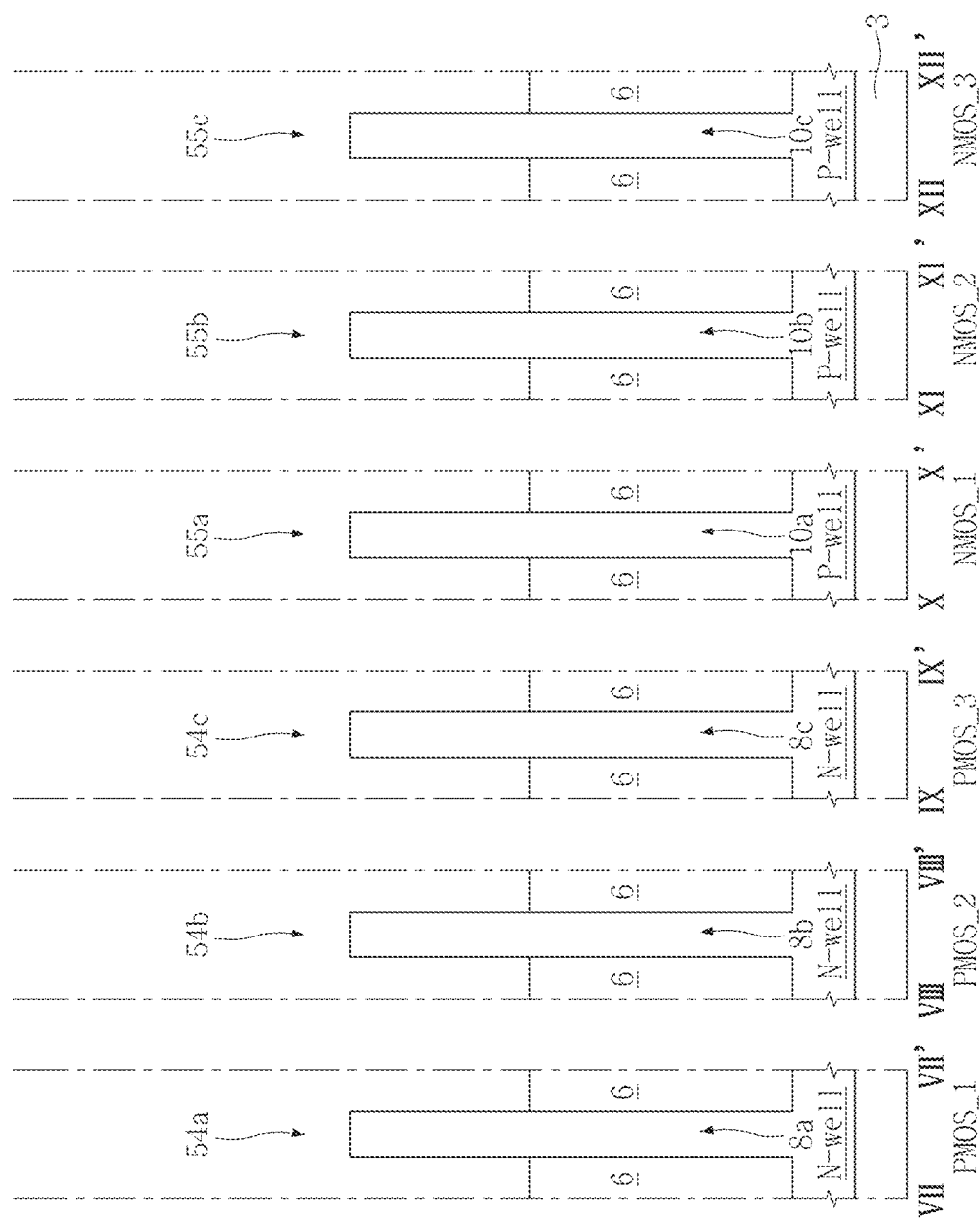

A semiconductor device in accordance with an exemplary embodiment of the inventive concept will be described with reference to FIGS. 1, 2, 3A, 3B, and 3C. FIG. 1 is a plan view conceptually illustrating a semiconductor device in accordance with an exemplary embodiment of the inventive concept. In FIG. 1, a first area marked as "A1" conceptually illustrates a first NMOS transistor area NMOS_1 and a first PMOS transistor area PMOS_1, a second area marked as "A2" conceptually illustrates a second NMOS transistor area NMOS_2 and a second PMOS transistor area PMOS_2, and a third area marked as "A3" conceptually illustrates a third NMOS transistor area NMOS_3 and a third PMOS transistor area PMOS_3. FIG. 2 is a plan view illustrating the first NMOS transistor area NMOS_1, the first PMOS transistor area PMOS_1, the second NMOS transistor area NMOS_2, the second PMOS transistor area PMOS_2, the third NMOS transistor area NMOS_3, and the third PMOS transistor area PMOS_3 of FIG. 1. FIGS. 3A, 3B, and 3C are cross-sectional views illustrating a semiconductor device in accordance with an exemplary embodiment of the inventive concept. In FIGS. 3A, 3B, and 3C, FIG. 3A is a cross-sectional view taken along lines I-I', II-II', and III-III' of FIG. 2, FIG. 3B is a cross-sectional view taken along lines IV-IV', V-V', and VI-VI' of FIG. 2, and FIG. 3C is a cross-sectional view taken along lines VII-VII', VIII-VIII', IX-IX', X-X', XI-XI', and XII-XII' of FIG. 2.

Referring to FIGS. 1, 2, 3A, 3B, and 3C, a semiconductor substrate 3 including the first area A1, the second area A2, and the third area A3 may be provided. The semiconductor substrate 3 may be a substrate formed of a semiconductor material such as silicon. The first PMOS transistor area PMOS_1 and the first NMOS transistor area NMOS_1 may be disposed in the first area A1 of the semiconductor substrate 3. The second PMOS transistor area PMOS_2 and the second NMOS transistor area NMOS_2 may be disposed in the second area A2 of the semiconductor substrate 3. The third PMOS transistor area PMOS_3 and the third NMOS transistor area NMOS_3 may be disposed in the third area A3 of the semiconductor substrate 3.

Isolation regions 6 defining a plurality of active regions may be disposed on the semiconductor substrate 3. The isolation regions 6 may be referred to as trench isolation regions. The isolation regions 6 may include silicon oxide.

The plurality of active regions may include a first PMOS active region 8a, a second PMOS active region 8b, a third PMOS active region 8c, a first NMOS active region 10a, a second NMOS active region 10b, and a third NMOS active region 10c. The first PMOS active region 8a may be disposed in the first PMOS transistor area PMOS_1 of the first area A1, and the first NMOS active region 10a may be disposed in the first NMOS transistor area NMOS_1 of the first area A1. The second PMOS active region 8b may be disposed in the second PMOS transistor area PMOS_2 of the second area A2, and the second NMOS active region 10b may be disposed in the second NMOS transistor area NMOS_2 of the second area A2. The third PMOS active region 8c may be disposed in the third PMOS transistor area PMOS_3 of the third area A3, and the third NMOS active region 10c may be disposed in the third NMOS transistor area NMOS_3 of the third area A3.

The first to third PMOS active regions 8a, 8b, and 8c may have a different conductivity type from the first to third NMOS active regions 10a, 10b, and 10c. The first to third PMOS active regions 8a, 8b, and 8c may be disposed in an N-well region of the semiconductor substrate 3 and may have N-type conductivity. The first to third NMOS active regions 10a, 10b, and 10c may be disposed in a P-well region of the semiconductor substrate 3 and may have P-type conductivity. The first to third PMOS active regions 8a, 8b, and 8c and the first to third NMOS active regions 10a, 10b, and 10c may have line or rectangular shapes.

The first PMOS active region 8a may include first PMOS fin protrusions Pp1 and first PMOS recessed areas Rp1 disposed between the first PMOS fin protrusions Pp1. The second PMOS active region 8b may include second PMOS fin protrusions Pp2 and second PMOS recessed areas Rp2 disposed between the second PMOS fin protrusions Pp2. The third PMOS active region 8c may include third PMOS fin protrusions Pp3 and third PMOS recessed areas Rp3 disposed between the third PMOS fin protrusions Pp3.

The first NMOS active region 10a may include first NMOS fin protrusions Pn1 and first NMOS recessed areas Rn1 disposed between the first NMOS fin protrusions Pn1. The second NMOS active region 10b may include second NMOS fin protrusions Pn2 and second NMOS recessed areas Rn2 disposed between the second NMOS fin protrusions Pn2. The third NMOS active region 10c may include third NMOS fin protrusions Pn3 and third NMOS recessed areas Rn3 disposed between the third NMOS fin protrusions Pn3.

In an embodiment, the first PMOS fin protrusions Pp1, the first NMOS fin protrusions Pn1, the second PMOS fin protrusions Pp2, the second NMOS fin protrusions Pn2, the third PMOS fin protrusions Pp3, and the third NMOS fin protrusions Pn3 may be disposed at a higher level than the isolation region 6.

In an embodiment, the first to third PMOS recessed areas Rp1, Rp2, and Rp3 may have different depths. The first PMOS recessed areas Rp1 may be disposed between the first PMOS fin protrusions Pp1 and have a first depth ΔHp1. The second PMOS recessed areas Rp2 may be disposed between the second PMOS fin protrusions Pp2 and has a second depth ΔHp2 greater than the first depth ΔHp1. The third PMOS recessed areas Rp3 may be disposed between the third PMOS fin protrusions Pp3 and have a third depth ΔHp3 greater than the second depth ΔHp2. The first PMOS recessed areas Rp1 may have bottom surfaces at the first depth ΔHp1, the second PMOS recessed areas Rp2 may have bottom surfaces at the second depth ΔHp2 greater than the first depth ΔHp1, and the third PMOS recessed areas Rp3 may have bottom surfaces at the third depth ΔHp3 greater than the second depth ΔHp2.

In an exemplary embodiment, a difference between top surfaces Tp1 of the first PMOS fin protrusions Pp1 and the bottom surfaces of the first PMOS recessed areas Rp1, that is, the first depth ΔHp1, may be smaller than a difference between top surfaces Tp2 of the second PMOS fin protrusions Pp2 and the bottom surfaces of the second PMOS recessed areas Rp2, that is, the second depth ΔHp2. In an exemplary embodiment, a difference between the top surfaces Tp2 of the second PMOS fin protrusions Pp2 and the bottom surfaces of the second PMOS recessed areas Rp2, that is, the second depth ΔHp2, may be smaller than a difference between top surfaces Tp3 of the third PMOS of the fin protrusions Pp3 and the bottom surfaces of the third PMOS recessed areas Rp3, that is, the third depth ΔHp3.

In an embodiment, the first to third NMOS recessed areas Rn1, Rn2, and Rn3 have different depths. In an embodiment, a depth ΔHn1 of the first NMOS recessed areas Rn1 may be greater than a depth ΔHn2 of the second NMOS recessed areas Rn2, and the depth ΔHn2 of the second NMOS recessed areas Rn2 may be greater than a depth ΔHn3 of the third NMOS recessed areas Rn3. In an embodiment, the depth ΔHn1, that is, a difference between top surfaces Tn1 of the first NMOS fin protrusions Pn1 and bottom surfaces of the first NMOS recessed areas Rn1, may be greater than the depth ΔHn2, that is, a difference between top surfaces Tn2 of the second NMOS fin protrusions Pn2 and bottom surfaces of the second NMOS recessed areas Rn2. In an embodiment, the depth ΔHn2, that is, the difference between the top surfaces Tn2 of the second NMOS fin protrusions Pn2 and the bottom surfaces of the second NMOS recessed areas Rn2, may be greater than the depth ΔHn3, that is, a difference between top surfaces Tn3 of the third NMOS fin protrusions Pn3 and bottom surfaces of the third NMOS recessed areas Rn3.

In an embodiment, the depths ΔHp1, ΔHp2, and ΔHp3 of the first to third PMOS recessed areas Rp1, Rp2, and Rp3 may be greater than the depths ΔHn1, ΔHn2, and ΔHn3 of the first to third NMOS recessed areas Rn1, Rn2, and Rn3.

In an embodiment, the first to third PMOS recessed areas Rp1, Rp2, and Rp3 may have different widths. In an embodiment, each of the first PMOS recessed areas Rp1 may have a first width Wp1, each of the second PMOS recessed areas Rp2 may have a second width Wp2 greater than the first width Wp1, and each of the third PMOS recessed areas Rp3 may have a third width Wp3 greater than the second width Wp2.

In an embodiment, the first to third NMOS recessed areas Rn1, Rn2, and Rn3 may have different widths. In an embodiment, a width Wn1 of the first NMOS recessed areas Rn1 may be greater than a width Wn2 of the second NMOS recessed areas Rn2, and the width Wn2 of the second NMOS recessed areas Rn2 may be greater than a width Wn3 of the third NMOS recessed areas Rn3.

The first PMOS transistor area PMOS_1 may include first PMOS gate structures 57a disposed on the first PMOS fin protrusions Pp1 of the first PMOS active region 8a, and first PMOS semiconductor layers 42a disposed in the first PMOS recessed areas Rp1 of the first PMOS active region 8a. In an embodiment, the first PMOS gate structures 57a may overlap the first PMOS fin protrusions Pp1 and extend onto the isolation region 6. The first PMOS gate structures 57a may include parallel line shapes or rectangular shapes. In an embodiment, the first PMOS gate structures 57a may face the top surfaces Tp1 and two side surfaces of the first PMOS fin protrusions Pp1. Accordingly, the first PMOS transistor area PMOS_1 may include FinFET transistors.

The second PMOS transistor area PMOS_2 may include second PMOS gate structures 57b disposed on the second PMOS fin protrusions Pp2 of the second PMOS active region 8b, and second PMOS semiconductor layers 42b disposed in the second PMOS recessed areas Rp2 of the second PMOS active region 8b. In an embodiment, the second PMOS gate structures 57b may overlap the second PMOS fin protrusions Pp2 and extend onto the isolation region 6. The second PMOS gate structures 57b may include parallel line shapes or rectangular shapes. In an embodiment, the second PMOS gate structures 57b may face the top surfaces Tp2 and two side surfaces of the second PMOS fin protrusions Pp2. Accordingly, the second PMOS transistor area PMOS_2 may include FinFET transistors.

The third PMOS transistor area PMOS_3 may include third PMOS gate structures 57c disposed on the third PMOS fin protrusions Pp3 of the third PMOS active region 8c, and third PMOS semiconductor layers 42c disposed in the third PMOS recessed areas Rp3 of the third PMOS active region 8c. In an embodiment, the third PMOS gate structures 57c may overlap the third PMOS fin protrusions Pp3 and extend onto the isolation region 6. The third PMOS gate structures 57c may include parallel line shapes or rectangular shapes. In an embodiment, the third PMOS gate structures 57c may face the top surfaces Tp3 and two side surfaces of the third PMOS fin protrusions Pp3. Accordingly, the third PMOS transistor area PMOS_3 may include FinFET transistors.

In an embodiment, distances L between the first PMOS gate structures 57a, between the second PMOS gate structures 57b, and between the third PMOS gate structures 57c may be the same. Each of the first to third PMOS gate structures 57a, 57b, and 57c may include a PMOS gate electrode 59 and a PMOS gate dielectric 58 disposed on bottom and side surfaces of the PMOS gate electrode 59. In an embodiment, a dielectric may be an electrical insulator that can be polarized by an applied electric field.

In an embodiment, the first to third PMOS semiconductor layers 42a, 42b, and 42c may have the same conductivity type. In an embodiment, the first to third PMOS semiconductor layers 42a, 42b, and 42c may have a different conductivity type from the first to third PMOS active regions 8a, 8b, and 8c. The first to third PMOS semiconductor layers 42a, 42b, and 42c may have P-type conductivity, and the first to third PMOS active regions 8a, 8b, and 8c may have N-type conductivity. The first to third PMOS semiconductor layers 42a, 42b, and 42c may be source/drain areas of the first to third PMOS transistor areas PMOS_1, PMOS_2, and PMOS_3. In an embodiment, each of the first to third PMOS semiconductor layers 42a, 42b, and 42c may include a PMOS low-concentration impurity area LIp and a PMOS high-concentration impurity area HIp disposed on the PMOS low-concentration impurity area LIp. The PMOS high-concentration impurity area HIp may have a higher impurity concentration than the PMOS low-concentration impurity area LIp.

Channel areas of transistors may be defined in the first PMOS fin protrusions Pp1 disposed between the first PMOS semiconductor layers 42a. Likewise, channel areas of transistors may be defined in the second and third PMOS fin protrusions Pp2 and Pp3. The first to third PMOS semiconductor layers 42a, 42b, and 42c may serve to improve carrier mobility of the PMOS transistors.

In an embodiment, the first to third PMOS semiconductor layers 42a, 42b, and 42c may be formed of the same material (e.g., silicon germanium). In an embodiment, the first to third PMOS semiconductor layers 42a, 42b, and 42c may be formed of a different material or a material having different composition ratios from the first to third PMOS active regions 8a, 8b, and 8c. In an embodiment, the first to third PMOS active regions 8a, 8b, and 8c may be formed of silicon, and the first to third PMOS semiconductor layers 42a, 42b, and 42c are formed of silicon germanium epitaxial layers.

In an embodiment, top surfaces of the first to third PMOS semiconductor layers 42a, 42b, and 42c may have different heights. In an embodiment, top surfaces of the first PMOS semiconductor layers 42a may be higher than top surfaces of the second PMOS semiconductor layers 42b, and the top surfaces of the second PMOS semiconductor layers 42b may be higher than top surfaces of the third PMOS semiconductor layers 42c. In an embodiment, the top surfaces of the first PMOS semiconductor layers 42a may be higher than the top surfaces Tp1 of the first PMOS fin protrusions Pp1. The top surfaces of the first PMOS semiconductor layers 42a may be disposed between the first PMOS gate structures 57a. In an embodiment, the top surfaces of the third PMOS semiconductor layers 42c may be lower than the top surfaces Tp3 of the third PMOS fin protrusions Pp3.

In an embodiment, a width Wp1 of each of the first PMOS semiconductor layers 42a may be smaller than a width Wp2 of each of the second PMOS semiconductor layers 42b. In an embodiment, the width Wp2 of each of the second PMOS semiconductor layers 42b may be smaller than a width Wp3 of each of the third PMOS semiconductor layers 42c.

The first NMOS transistor area NMOS_1 may include first NMOS gate structures 63a disposed on the first NMOS fin protrusions Pn1 of the first NMOS active region 10a, and first NMOS semiconductor layers 33a disposed in the first NMOS recessed areas Rn1 of the first NMOS active region 10a. In an embodiment, the first NMOS gate structures 63a may overlap the first NMOS fin protrusions Pn1 and extend onto the isolation region 6. The first NMOS gate structures 63a may have parallel line shapes or rectangular shapes. In an embodiment, the first NMOS gate structures 63a may face the top surfaces Tn1 and two side surfaces of the first NMOS fin protrusions Pn1. Accordingly, the first NMOS transistor area NMOS_1 may include FinFET transistors.

The second NMOS transistor area NMOS_2 may include second NMOS gate structures 63b disposed on the second NMOS fin protrusions Pn2 of the second NMOS active region 10b, and second NMOS semiconductor layers 33b disposed in the second NMOS recessed areas Rn2 of the second NMOS active region 10b. In an embodiment, the second NMOS gate structures 63b may overlap the second NMOS fin protrusions Pn2 and extend onto the isolation region 6. The second NMOS gate structures 63b may have parallel line shapes or rectangular shapes. In an embodiment, the second NMOS gate structures 63b may face the top surfaces Tn2 and two side surfaces of the second NMOS fin protrusions Pn2. Accordingly, the second NMOS transistor area NMOS_2 may include FinFET transistors.

The third NMOS transistor area NMOS_3 may include third NMOS gate structures 63c disposed on the third NMOS fin protrusions Pn3 of the third NMOS active region 10c, and third NMOS semiconductor layers 33c disposed in the third NMOS recessed areas Rn3 of the third NMOS active region 10c. In an embodiment, the third NMOS gate structures 63c may overlap the third NMOS fin protrusions Pn3 and extend onto the isolation region 6. The third NMOS gate structures 63c may have parallel line shapes or rectangular shapes. In an embodiment, the third NMOS gate structures 63c may face the top surfaces Tn3 and two side surfaces of the third NMOS fin protrusions Pn3. Accordingly, the third NMOS transistor area NMOS_3 may include FinFET transistors.

In an embodiment, distances L between the first NMOS gate structures 63a, between the second NMOS gate structures 63b, and between the third NMOS gate structures 63c may be the same. Each of the first to third NMOS gate structures 63a, 63b, and 63c may include an NMOS gate electrode 65 and an NMOS gate dielectric 64 disposed on bottom and side surfaces of the NMOS gate electrode 65.

In an embodiment, the first to third NMOS semiconductor layers 33a, 33b, and 33c may have the same conductivity type. In an embodiment, the first to third NMOS semiconductor layers 33a, 33b, and 33c may have a different conductivity type from the first to third NMOS active regions 10a, 10b, and 10c. The first to third NMOS semiconductor layers 33a, 33b, and 33c may have N-type conductivity, and the first to third NMOS active regions 10a, 10b, and 10c may have P-type conductivity. The first to third NMOS semiconductor layers 33a, 33b, and 33c may be source/drain areas of the first to third NMOS transistor areas NMOS_1, NMOS_2, and NMOS_3. Each of the first to third NMOS semiconductor layers 33a, 33b, and 33c may include an NMOS low-concentration impurity area LIn and an NMOS high-concentration impurity area HIn disposed on the NMOS low-concentration impurity area LIn. The NMOS high-concentration impurity area HIn may have a higher impurity concentration than the NMOS low-concentration impurity area LIn.

Channel areas of transistors may be defined in the first NMOS fin protrusions Pn1 disposed between the first NMOS semiconductor layers 33a. Likewise, channel areas of transistors may be defined in the second and third NMOS fin protrusions Pn2 and Pn3.

In an embodiment, the first to third NMOS semiconductor layers 33a, 33b, and 33c may be formed of the same material (e.g., silicon). In an embodiment, the first to third NMOS semiconductor layers 33a, 33b, and 33c may be formed in epitaxial layers of a different material from the first to third NMOS active regions 10a, 10b, and 10c. For example, the first to third NMOS semiconductor layers 33a, 33b, and 33c may be formed of silicon epitaxial layers, and the first to third NMOS active regions 10a, 10b, and 10c may be formed of silicon germanium epitaxial layers.

In an embodiment, top surfaces of the first to third NMOS semiconductor layers 33a, 33b, and 33c may have different heights. In an embodiment, top surfaces of the first NMOS semiconductor layers 33a may be lower than top surfaces of the second NMOS semiconductor layers 33b. In an embodiment, the top surfaces of the second NMOS semiconductor layers 33b may be lower than top surfaces of the third NMOS semiconductor layers 33c.

In an embodiment, the top surfaces of the first NMOS semiconductor layers 33a may be formed at a lower level than the top surfaces Tn1 of the first NMOS fin protrusions Pn1. In an embodiment, the top surfaces of the third NMOS semiconductor layers 33c may be formed at a higher level than the top surfaces Tn3 of the third NMOS fin protrusions Pn3. The top surfaces of the first NMOS semiconductor layers 33a may be disposed between the first NMOS gate structures 63a.

In an embodiment, a width Wn1 of each of the first NMOS semiconductor layers 33a may be smaller than a width Wn2 of each of the second NMOS semiconductor layers 33b. In an embodiment, the width Wn2 each of the second NMOS semiconductor layers 33b may be smaller than a width Wn3 of each of the third NMOS semiconductor layers 33c.

First PMOS contact structures 72p1 may be disposed on the first PMOS semiconductor layers 42a, second PMOS contact structures 72p2 may be disposed on the second PMOS semiconductor layers 42b, and third PMOS contact structures 72p3 may be disposed on the third PMOS semiconductor layers 42c. First NMOS contact structures 72n1 may be disposed on the first NMOS semiconductor layers 33a, second NMOS contact structures 72n2 may be disposed on the second NMOS semiconductor layers 33b, and third NMOS contact structures 72n3 may be disposed on the third NMOS semiconductor layers 33c.

In an embodiment, the first to third PMOS contact structures 72p1, 72p2, and 72p3 and the first to third NMOS contact structures 72n1, 72n2, and 72n3 may be formed of a conductive material (e.g., Titanium nitride TiN, Tungsten nitride WN, or Tungsten W).

First PMOS silicide layers 68p1 may be disposed between the first PMOS semiconductor layers 42a and the first PMOS contact structures 72p1, second PMOS silicide layers 68p2 may be disposed between the second PMOS semiconductor layers 42b and the second PMOS contact structures 72p2, and third PMOS silicide layers 68p3 may be disposed between the third PMOS semiconductor layers 42c and the third PMOS contact structures 72p3. First NMOS silicide layers 68n1 may be disposed between the first NMOS semiconductor layers 33a and the first NMOS contact structures 72n1, second NMOS silicide layers 68n2 may be disposed between the second NMOS semiconductor layers 33b and the second NMOS contact structures 72n2, and third NMOS silicide layers 68n3 may be disposed between the third NMOS semiconductor layers 33c and the third NMOS contact structures 72n3.

Insulating gate spacers 24 may be disposed on side surfaces of the first to third PMOS gate structures 57a, 57b, and 57c and the first to third NMOS gate structures 63a, 63b, and 63c. The insulating gate spacers 24 may be interposed between the first PMOS gate structures 57a and the first PMOS contact structures 72p1, between the second PMOS gate structures 57b and the second PMOS contact structures 72p2, between the third PMOS gate structures 57c and the third PMOS contact structures 72p3, between the first NMOS gate structures 63a and the first NMOS contact structures 72n1, between the second NMOS gate structures 63b and the second NMOS contact structures 72n2, and between the third NMOS gate structures 63c and the third NMOS contact structures 72n3.

An interlayer insulating layer 51 may be disposed on the semiconductor substrate 3. The interlayer insulating layer 51 may be disposed on the isolation region 6 next to the first to third PMOS gate structures 57a, 57b, and 57c, and on the isolation region 6 next to the first to third NMOS gate structures 63a, 63b, and 63c.

In an exemplary embodiment, the first area A1 may be a circuit region in which a density of the first PMOS transistor area PMOS_1 is high, and the third area A3 is a circuit region in which a density of the third PMOS transistor area PMOS_3 is low. In this embodiment, the second area A2 may be a circuit region in which a density of the second PMOS transistor area PMOS_2 is lower than the density of the first PMOS transistor area PMOS_1 in the first area A1 and higher than the density of the third PMOS transistor area PMOS_3 in the third area A3. In an embodiment, the first area A1 may be a circuit region in which a density of the first NMOS transistor area NMOS_1 is low, and the third area A3 may be a circuit region in which a density of the third NMOS transistor area NMOS_3 is high. In this embodiment, the second area A2 may be a circuit region in which a density of the second NMOS transistor area NMOS_2 is higher than the density of the first NMOS transistor area NMOS_1 in the first area A1 and lower than the density of the third NMOS transistor area NMOS_3 in the third area A3.

The density of the first PMOS transistor area PMOS_1 in the first area A1 may be higher than the density of the second PMOS transistor areas PMOS_2 in the second area A2, and the density of the second PMOS transistor areas PMOS_2 in the second area A2 may be higher than the density of the third PMOS transistor areas PMOS_3 in the third area A3. The density of the first NMOS transistor areas NMOS_1 in the first area A1 may be lower than the density of the second NMOS transistor areas NMOS_2 in the second area A2, and the density of the second NMOS transistor areas NMOS_2 in the second area A2 may be lower than the density of the third NMOS transistor areas NMOS_3 in the third area A3.

In an embodiment, the first PMOS transistor area PMOS_1 may refer to an area in which a plurality of PMOS transistors are disposed. Likewise, each of the second and third PMOS transistor areas PMOS_2 and PMOS_3 may refer to an area in which a plurality of PMOS transistors are disposed. Likewise, each of the first to third NMOS transistor areas NMOS_1, NMOS2, and NMOS_3 may refer to an area in which a plurality of NMOS transistors are disposed.

In an exemplary embodiment, the term "density" in the phrase "the density of the first PMOS transistor areas PMOS_1" may refer to a density of the area of the first PMOS transistor areas PMOS_1 in the first area A1. Likewise, densities of the second and third PMOS transistor areas PMOS_2 and PMOS_3, and densities of the first to third NMOS transistor areas NMOS_1, NMOS2, and NMOS_3 may be densities of the areas thereof.

In an exemplary embodiment, the "density" may be an area density of transistor areas in a specific region. However, the embodiments of the inventive concept are not limited thereto. For example, the "density" may be a pattern density, an arrange density, or a disposition density of components or patterns configuring transistors. For example, a relationship between the densities of the first and second PMOS transistor areas PMOS_1 and PMOS_2 in the first and second areas A1 and A2 may be described as a relationship between the pattern densities of the first and second PMOS gate structures 57a and 57b in the first and second areas A1 and A2. For example, a pattern density of the first PMOS gate structures 57a configuring the first PMOS transistor area PMOS_1 in the first area A1 may be greater than a pattern density of the second PMOS gate structures 57b configuring the second PMOS transistor area PMOS_2 in the second area A2. Alternatively, the relationship between the densities of the first and second PMOS transistor areas PMOS_1 and PMOS_2 in the first and second areas A1 and A2 may be described as a relationship between disposition densities or area densities of the first and second PMOS semiconductor layers 42a and 42b in the first and second areas A1 and A2. Further, the relationship between the densities of the first and second PMOS transistor areas PMOS_1 and PMOS_2 in the first and second areas A1 and A2 may be described as a relationship between disposition densities or area densities of the first and second PMOS active regions 8a and 8b in the first and second areas A1 and A2.

In an embodiment, in the first to third areas A1, A2, and A3, the first to third PMOS gate structures 57a, 57b, and 57c and the first to third NMOS gate structures 63a, 63b, and 63c may be disposed at regular intervals L. Further, in this embodiment, the first to third NMOS semiconductor layers 33a, 33b, and 33c having different sizes and the first to third PMOS semiconductor layers 42a, 42b, and 42c having different sizes may be disposed in the areas. The first to third NMOS semiconductor layers 33a, 33b, and 33c and the first to third PMOS semiconductor layers 42a, 42b, and 42c may improve carrier mobility in the channel areas of the transistors and improve the performance of the semiconductor device.

Next, a method of forming the semiconductor device described with reference to FIGS. 1, 2, 3A, 3B, and 3C in accordance with an exemplary embodiment of the inventive concept will be described with reference to FIGS. 4A to 12C. In FIGS. 4A to 12C, FIGS. 4A, 5A, 6A, 7A, 8A, 9A, 10A, 11A, and 12A are cross-sectional views taken along lines I-I', II-II', and III-III' of FIG. 2, FIGS. 4B, 5B, 6B, 7B, 8A, 9B, 10B, 11B, and 12B are cross-sectional views taken along lines IV-IV', V-V', and VI-VI' of FIG. 2, and FIGS. 4C, 5C, 6C, 7C, 8C, 9C, 10C, 11C, and 12C are cross-sectional views taken along lines VII-VII', VIII-VIII', IX-IX', X-X', XI-XI', and XII-XII' of FIG. 2.

Referring to FIGS. 1, 2, 4A, 4B, and 4C, the method of forming the semiconductor device in accordance with the embodiment of the inventive concept may include forming an isolation region 6 defining a plurality of active regions in a semiconductor substrate 3 including a first area A1, a second area A2, and a third area A3.

The method of forming the semiconductor device in accordance with the embodiment of the inventive concept may include forming first to third PMOS sacrificial gate patterns 15a, 15b, and 15c, first to third NMOS sacrificial gate patterns 16a, 16b, and 16c, and gate spacers 24.

The isolation region 6 may be a trench-type device isolation region. In an embodiment, a top surface of the isolation region 6 may be lower than top surfaces of the plurality of active regions. Upper portions of the plurality of active regions may protrude from the top surface of the isolation region 6.

The plurality of active regions may include at least one first PMOS active region 8a, at least one second PMOS active region 8b, at least one third PMOS active region 8c, at least one first NMOS active region 10a, at least one second NMOS active region 10b, and at least one third NMOS active region 10c.

The first to third PMOS active regions 8a, 8b, and 8c may be formed in an N-well region of the semiconductor substrate 3. The first to third NMOS active regions 10a, 10b, and 10c may be formed in a P-well region of the semiconductor substrate 3.

The first PMOS active region 8a and the first NMOS active region 10a may be disposed in the first area A1. The second PMOS active region 8b and the second NMOS active region 10b may be disposed in the second area A2. The third PMOS active region 8c and third NMOS active region 10c may be disposed in the third area A3.

In an embodiment, a density of the first PMOS active regions 8a in the first area A1 may be higher than a density of the second PMOS active regions 8b in the second area A2, and the density of the second PMOS active regions 8b in the second area A2 may be greater than a density of the third PMOS active regions 8c in the third area A3. In an embodiment, a density of the first NMOS active regions 10a in the first area A1 may be lower than a density of the second NMOS active regions 10b in the second area A2, and the density of the second NMOS active regions 10b in the second area A2 may be lower than a density of the third NMOS active regions 10c in the third area A3.

Each of the first to third PMOS sacrificial gate patterns 15a, 15b, and 15c and the first to third NMOS sacrificial gate patterns 16a, 16b, and 16c may include a sequentially stacked buffer insulating pattern 18, a lower sacrificial pattern 20, and an upper sacrificial pattern 22.

The formation of the first to third PMOS sacrificial gate patterns 15a, 15b, and 15c and the first to third NMOS sacrificial gate patterns 16a, 16b, and 16c may include conformally forming a buffer insulating layer on surfaces of the plurality of active regions and the isolation region 6, forming a lower sacrificial layer on the buffer insulating layer, forming an upper sacrificial layer on the lower sacrificial layer, and patterning the upper sacrificial layer, the lower sacrificial layer, and the buffer insulating layer. The buffer insulating patterns 18 may be formed of silicon oxide, the lower sacrificial patterns 20 may be formed of polysilicon, and the upper sacrificial patterns 22 may be formed of silicon nitride.

The gate spacers 24 may be formed on side surfaces of the first to third PMOS sacrificial gate patterns 15a, 15b, and 15c and the first to third NMOS sacrificial gate patterns 16a, 16b, and 16c. The gate spacers 24 may be formed of an insulating material, such as silicon oxide and/or silicon nitride.

The first PMOS sacrificial gate patterns 15a may have line shapes crossing or overlapping the first PMOS active region 8a and extending onto the isolation region 6. The second PMOS sacrificial gate patterns 15b may have line shapes crossing or overlapping the second PMOS active region 8b and extending onto the isolation region 6. The third PMOS sacrificial gate patterns 15c may have line shapes crossing or overlapping the third PMOS active region 8c and extending onto the isolation region 6.

The first NMOS sacrificial gate patterns 16a may have line shapes crossing or overlapping the first NMOS active region 10a and extending onto the isolation region 6. The second NMOS sacrificial gate patterns 16b may have line shapes crossing or overlapping the second NMOS active region 10b and extending onto the isolation region 6. The third NMOS sacrificial gate patterns 16c may have line shapes crossing or overlapping the third NMOS active region 10c and extending onto the isolation region 6.

In an embodiment, a distance between the first PMOS sacrificial gate patterns 15a, a distance between the second PMOS sacrificial gate patterns 15b, and a distance between the third PMOS sacrificial gate patterns 15c may be the same. In an embodiment, a distance between the first NMOS sacrificial gate patterns 16a, a distance between the second NMOS sacrificial gate patterns 16b, and a distance between the third NMOS sacrificial gate patterns 16c may be the same. In an embodiment, the distance between the first PMOS sacrificial gate patterns 15a and the distance between the first NMOS sacrificial gate patterns 16a may be the same.

Referring to FIGS. 1, 2, 5A, 5B, and 5C, the method of forming the semiconductor device in accordance with an embodiment of the inventive concept may include forming first to third NMOS recessed areas Rn1, Rn2, and Rn3 in the first to third NMOS active regions 10a, 10b, and 10c.

The formation of the first to third NMOS recessed areas Rn1, Rn2, and Rn3 includes forming a first etch mask 30 covering the first to third PMOS active regions 8a, 8b, and 8c and does not overlap the first to third NMOS active regions 10a, 10b, and 10c, and etching the first to third NMOS active regions 10a, 10b, and 10c using the first etch mask 30, the first to third NMOS sacrificial gate patterns 16a, 16b, and 16c, and the gate spacers 24 as etch masks. For example, since the first to third NMOS active regions 10a, 10b, and 10c are not covered by the first etch mask 30, they are exposed. The first etch mask 30 may be formed with a photoresist pattern. In an exemplary embodiment, an exposed area of the first NMOS active region 10a in the first area A1 may be smaller than an exposed area of the second NMOS active region 10b in the second area A2, and the exposed area of the second NMOS active region 10b in the second area A2 may be smaller than an exposed area of the third NMOS active region 10c in the third area A3.

In an embodiment, the first to third NMOS recessed areas Rn1, Rn2, and Rn3 have different depths. In an embodiment, the first NMOS active region 10a in the first area A1 may be etched more than the second NMOS active region 10b in the second area A2, and the second NMOS active region 10b in the second area A2 may be etched more than the third NMOS active region 10c in the third area A3. In an embodiment, a depth ΔHn1 of the first NMOS recessed areas Rn1 may be greater than a depth ΔHn2 of the second NMOS recessed areas Rn2, and the depth ΔHn2 of the second NMOS recessed areas Rn2 may be greater than a depth ΔHn3 of the third NMOS recessed areas Rn3.

In an embodiment, the first to third NMOS recessed areas Rn1, Rn2, and Rn3 may have different widths. In an embodiment, a width Wn1 of the first NMOS recessed areas Rn1 may greater than a width Wn2 of the second NMOS recessed areas Rn2, and the width Wn2 the second NMOS recessed areas Rn2 may greater than a width Wn3 of the third NMOS recessed areas Rn3.

In the first NMOS active region 10a, non-etched active regions disposed under the first NMOS sacrificial gate patterns 16a may be defined as first NMOS fin protrusions Pn1. In the second NMOS active region 10b, non-etched active regions disposed under the second NMOS sacrificial gate patterns 16b may be defined as second NMOS fin protrusions Pn2. In the third NMOS active region 10c, non-etched active regions disposed under the third NMOS sacrificial gate patterns 16c may be defined as third NMOS fin protrusions Pn3.

In an embodiment, a height difference ΔHn1 between top surfaces Tn1 of the first NMOS fin protrusions Pn1 and bottom surfaces of the first NMOS recessed areas Rn1 may be greater than a height difference ΔHn2 between top surfaces Tn2 of the second NMOS fin protrusions Pn2 and bottom surfaces of the second NMOS recessed areas Rn2. In an embodiment, the height difference ΔHn2 between the top surfaces Tn2 of the second NMOS fin protrusions Pn2 and the bottom surfaces of the second NMOS recessed areas Rn2 may be greater than a height difference ΔHn3 between top surfaces Tn3 of the third NMOS fin protrusions Pn3 and bottom surfaces of the third NMOS recessed areas Rn3.

In an embodiment, before the first etch mask 30 is formed, first surface protection layers 27 may be formed on the exposed surfaces of the active regions 8a, 8b, 8c, 10a, 10b, and 10c. The first surface protection layers 27 may be formed of silicon oxide. The first surface protection layers 27 may be formed on surfaces of the first to third PMOS active regions 8a, 8b, and 8c disposed between the first to third PMOS sacrificial gate patterns 15a, 15b, and 15c.

After the first to third NMOS recessed areas Rn1, Rn2, and Rn3 may be formed, the first etch mask 30 may be removed.

Referring to FIGS. 1, 2, 6A, 6B, and 6C, the method of forming the semiconductor device in accordance with an embodiment of the inventive concept may include forming first to third NMOS semiconductor layers 33a, 33b, and 33c.

The first NMOS semiconductor layers 33a may be formed in the first NMOS recessed areas Rn1, the second NMOS semiconductor layers 33b may be formed in the second NMOS recessed areas Rn2, and the third NMOS semiconductor layers 33c may be formed in the third NMOS recessed areas Rn3.

The first to third NMOS semiconductor layers 33a, 33b, and 33c may be formed by performing a first selective epitaxial growth (SEG) process. In a SEG process, growth may occur only on exposed silicon areas of a silicon substrate. During the first SEG process, the first surface protection layers 27 may prevent the growth of epitaxial layers on the surfaces of the first to third PMOS active regions 8a, 8b, and 8c.

The first to third NMOS semiconductor layers 33a, 33b, and 33c may be formed as doped epitaxial layers. The first to third NMOS semiconductor layers 33a, 33b, and 33c may be formed as silicon epitaxial layers having P-type conductivity.

In an embodiment, top surfaces of the first to third NMOS semiconductor layers 33a, 33b, and 33c may have different heights. In an embodiment, top surfaces of the third NMOS semiconductor layers 33c may be higher than top surfaces of the second NMOS semiconductor layers 33b, and the top surfaces of the second NMOS semiconductor layers 33b may be higher than top surfaces of the first NMOS semiconductor layers 33a.

In an embodiment, the top surfaces of the first NMOS semiconductor layers 33a may be formed at a lower level than the top surfaces Tn1 of the first NMOS fin protrusions Pn1. In this embodiment, the top surfaces of the second NMOS semiconductor layers 33b may be formed substantially at the same level as the top surfaces Tn2 of the second NMOS fin protrusions Pn2. In this embodiment, the top surfaces of the third NMOS semiconductor layers 33c may be formed at a higher level than the top surfaces Tn3 of the third NMOS fin protrusions Pn3.

In an embodiment, the width Wn1 of each first NMOS semiconductor layer 33a may be smaller than the width Wn2 of each second NMOS semiconductor layer 33b. In this embodiment, the width Wn2 of each second NMOS semiconductor layer 33b may be smaller than the width Wn3 of each third NMOS semiconductor layer 33c.

Referring to FIGS. 1, 2, 7A, 7B, and 7C, the method of forming the semiconductor device in accordance with an embodiment of the inventive concept may include forming first to third PMOS recessed areas Rp1, Rp2, and Rp3.

The formation of the first to third PMOS recessed areas Rp1, Rp2, and Rp3 may include forming a second etch mask 39 which covers the first to third NMOS active regions 10a, 10b, and 10c and does not overlap the first to third PMOS active regions 8a, 8b, and 8c, and etching the first to third PMOS active regions 8a, 8b, and 8c using the second etch mask 39, the first to third PMOS sacrificial gate patterns 15a, 15b, and 15c, and the gate spacers 24 as etch masks. The second etch mask 39 may be formed with a photoresist pattern. For example, since the first to third PMOS active regions 8a, 8b, and 8c are not covered by the second etch mask 39, they are exposed. In an embodiment, an exposed area of the first PMOS active region 8a in the first area A1 may be greater than an exposed area of the second PMOS active region 8b in the second area A2, and the exposed area of the second PMOS active region 8b in the second area A2 may be greater than an exposed area of the third PMOS active region 8c in the third area A3.

In an embodiment, the first to third PMOS recessed areas Rp1, Rp2, and Rp3 may have different depths. In an embodiment, the first PMOS active region 8a in the first area A1 may be etched less than the second PMOS active region 8b in the second area A2, and the second PMOS active region 8b in the second area A2 may be etched less than the third PMOS active region 8c in the third area A3. In an embodiment, a depth ΔHp1 of the first PMOS recessed areas Rp1 may be shallower than a depth ΔHp2 of the second PMOS recessed areas Rp2, and the depth ΔHp2 of the second PMOS recessed areas Rp2 may be shallower than a depth ΔHp3 of the third PMOS recessed areas Rp3.

In an embodiment, the first to third PMOS recessed areas Rp1, Rp2, and Rp3 may have different widths. In an embodiment, a width Wp1 of the first PMOS recessed areas Rp1 may be smaller than a width Wp2 of the second PMOS recessed areas Rp2, and the width Wp2 of the second PMOS recessed areas Rp2 may be smaller than a width Wp3 of the third PMOS recessed areas Rp3.

In the first PMOS active region 8a, non-etched active regions disposed under the first PMOS sacrificial gate patterns 15a may be defined as first PMOS fin protrusions Pp1. In the second PMOS active region 8b, non-etched active regions disposed under the second PMOS sacrificial gate patterns 15b may be defined as second PMOS fin protrusions Pp2. In the third PMOS active region 8c, non-etched active regions disposed under the third PMOS sacrificial gate patterns 15c may be defined as third PMOS fin protrusions Pp3.

In an embodiment, a height difference ΔHp1 between top surfaces Tp1 of the first PMOS fin protrusions Pp1 and bottom surfaces of the first PMOS recessed areas Rp1 may be smaller than a height difference ΔHp2 between top surfaces Tp2 of the second PMOS fin protrusions Pp2 and bottom surfaces of the second PMOS recessed areas Rp2. In an embodiment, the height difference ΔHp2 between the top surfaces Tp2 of the second PMOS fin protrusions Pp2 and the bottom surfaces of the second PMOS recessed areas Rp2 may be smaller than a height difference ΔHp3 between top surfaces Tp3 of the third PMOS fin protrusions Pp3 and bottom surfaces of the third PMOS recessed areas Rp3.

In an embodiment, second surface protection layers 36 may be formed on the exposed surfaces of the first to third NMOS semiconductor layers 33a, 33b, and 33c, before the second etch mask 39 is formed. The second surface protection layers 36 may be formed of silicon oxide.

After the first to third PMOS recessed areas Rp1, Rp2, and Rp3 are formed, the second etch mask 39 may be removed.

Referring to FIGS. 1, 2, 8A, 8B, and 8C, the method of forming the semiconductor device in accordance with an exemplary embodiment of the inventive concept include forming first to third PMOS semiconductor layers 42a, 42b, and 42c.

The first to third PMOS semiconductor layers 42a, 42b, and 42c may be formed by performing a second SEG process. During the second SEG process, the second surface protection layers 36 may prevent the growth of epitaxial layers on the surfaces of the first to third NMOS semiconductor layers 33a, 33b, and 33c.

The first PMOS semiconductor layers 42a may be formed in the first PMOS recessed areas Rp1, the second PMOS semiconductor layers 42b may be formed in the second PMOS recessed areas Rp2, and the third PMOS semiconductor layers 42c may be formed in the third PMOS recessed areas Rp3.

In an embodiment, top surfaces of the first to third PMOS semiconductor layers 42a, 42b, and 42c may have different heights. In an embodiment, top surfaces of the first PMOS semiconductor layers 42a may be higher than top surfaces of the second PMOS semiconductor layers 42b, and the top surfaces of the second PMOS semiconductor layers 42b may be higher than top surfaces of the third PMOS semiconductor layers 42c.

In an embodiment, the top surfaces of the first PMOS semiconductor layers 42a may be higher than the top surfaces Tp1 of the first PMOS fin protrusions Pp1. In this embodiment, the top surfaces of the second PMOS semiconductor layers 42b may be substantially at the same level as the top surfaces Tp2 of the second PMOS fin protrusions Pp2. In this embodiment, the top surfaces of the third PMOS semiconductor layers 42c may be lower than the top surfaces Tp3 of the third PMOS fin protrusions Pp3.

The first to third PMOS semiconductor layers 42a, 42b, and 42c may be doped epitaxial layers. For example, the first to third PMOS semiconductor layers 42a, 42b, and 42c may be epitaxial layers having P-type conductivity.

In an embodiment, the first to third PMOS semiconductor layers 42a, 42b, and 42c may be formed of a different material from the first to third NMOS semiconductor layers 33a, 33b, and 33c. For example, the first to third NMOS semiconductor layers 33a, 33b, and 33c may be formed of silicon, and the first to third PMOS semiconductor layers 42a, 42b, and 42c may be formed of silicon germanium.

Referring to FIGS. 1, 2, 9A, 9B, and 9C, the method of forming the semiconductor device in accordance with an embodiment of the inventive concept may include forming PMOS high-concentration impurity areas HIp and NMOS high-concentration impurity areas HIn.

By selectively implanting impurities into the first to third PMOS semiconductor layers 42a, 42b, and 42c in a first ion-implantation process 48p, the PMOS high-concentration impurity areas HIp having a higher impurity concentration than the first to third PMOS semiconductor layers 42a, 42b, and 42c may be formed. In the first to third PMOS semiconductor layers 42a, 42b, and 42c, portions under the PMOS high-concentration impurity areas Hip may be defined as PMOS low-concentration impurity areas LIp.

After or before the first ion-implantation process 48p is performed, by selectively implanting impurities into the first to third NMOS semiconductor layers 33a, 33b, and 33c in a second ion-implantation process 48n, the NMOS high-concentration impurity areas HIn having a higher impurity concentration than the first to third NMOS semiconductor layers 33a, 33b, and 33c may be formed. In the first to third NMOS semiconductor layers 33a, 33b, and 33c, portions under the NMOS high-concentration impurity areas HIn may be defined as NMOS low-concentration impurity areas LIn. In an embodiment, an ion-implantation process, is a process by which ions of a first material are accelerated in an electrical field and impacted into a second material.

Referring to FIGS. 1, 2, 10A, 10B, and 10C, the method of forming the semiconductor device in accordance with an embodiment of the inventive concept may include forming a planarized interlayer insulating layer 51.

The formation of the planarized interlayer insulating layer 51 may include forming an interlayer insulating layer covering the first to third PMOS semiconductor layers 42a, 42b, and 42c, the first to third NMOS semiconductor layers 33a, 33b, and 33c, the first to third PMOS sacrificial gate patterns 15a, 15b, and 15c, and the first to third NMOS sacrificial gate patterns 16a, 16b, and 16c, and planarizing the interlayer insulating layer until the upper sacrificial patterns 22 of the first to third PMOS sacrificial gate patterns 15a, 15b, and 15c and the first to third NMOS sacrificial gate patterns 16a, 16b, and 16c are exposed. The planarization may be performed by a chemical mechanical polishing (CMP) process. In an embodiment, the CMP process uses a combination of chemical and mechanical forces to smooth a surface. The CMP process may use an abrasive and corrosive chemical slurry in conjunction with a polishing pad.

The planarized interlayer insulating layer 51 may be formed of silicon oxide.

Referring to FIGS. 1, 2, 11A, 11B, and 11C, the method of forming the semiconductor device in accordance with an embodiment of the inventive concept may include removing the first to third PMOS sacrificial gate patterns 15a, 15b, and 15c to form first to third PMOS gate trenches 54a, 54b, and 54c, and removing the first to third NMOS sacrificial gate patterns 16a, 16b, and 16c to form first to third NMOS gate trenches 55a, 55b, and 55c.

The first to third PMOS sacrificial gate patterns 15a, 15b, and 15c and the first to third NMOS sacrificial gate patterns 16a, 16b, and 16c may be selectively removed using an etching process.

The first PMOS sacrificial gate patterns 15a may be removed to form the first PMOS gate trenches 54a and expose the first PMOS fin protrusions Pp1. The second PMOS sacrificial gate patterns 15b may be removed to form the second PMOS gate trenches 54b and expose the second PMOS fin protrusions Pp2. The third PMOS sacrificial gate patterns 15c may be removed to form the third PMOS gate trenches 54c and expose the third PMOS fin protrusions Pp3.

The first NMOS sacrificial gate patterns 16a may be removed to form the first NMOS gate trenches 55a and expose the first NMOS fin protrusions Pn1. The second NMOS sacrificial gate patterns 16b may be removed to form the second NMOS gate trenches 55b and expose the second NMOS fin protrusions Pn2. The third NMOS sacrificial gate patterns 16c may be removed to form the third NMOS gate trenches 55c and the third NMOS fin protrusions Pn3.

Referring to FIGS. 1, 2, 12A, 12B, and 12C, the method of forming the semiconductor device in accordance with an embodiment of the inventive concept includes forming first to third PMOS gate structures 57a, 57b, and 57c and first to third NMOS gate structures 63a, 63b, and 63c.

Figure 12A:
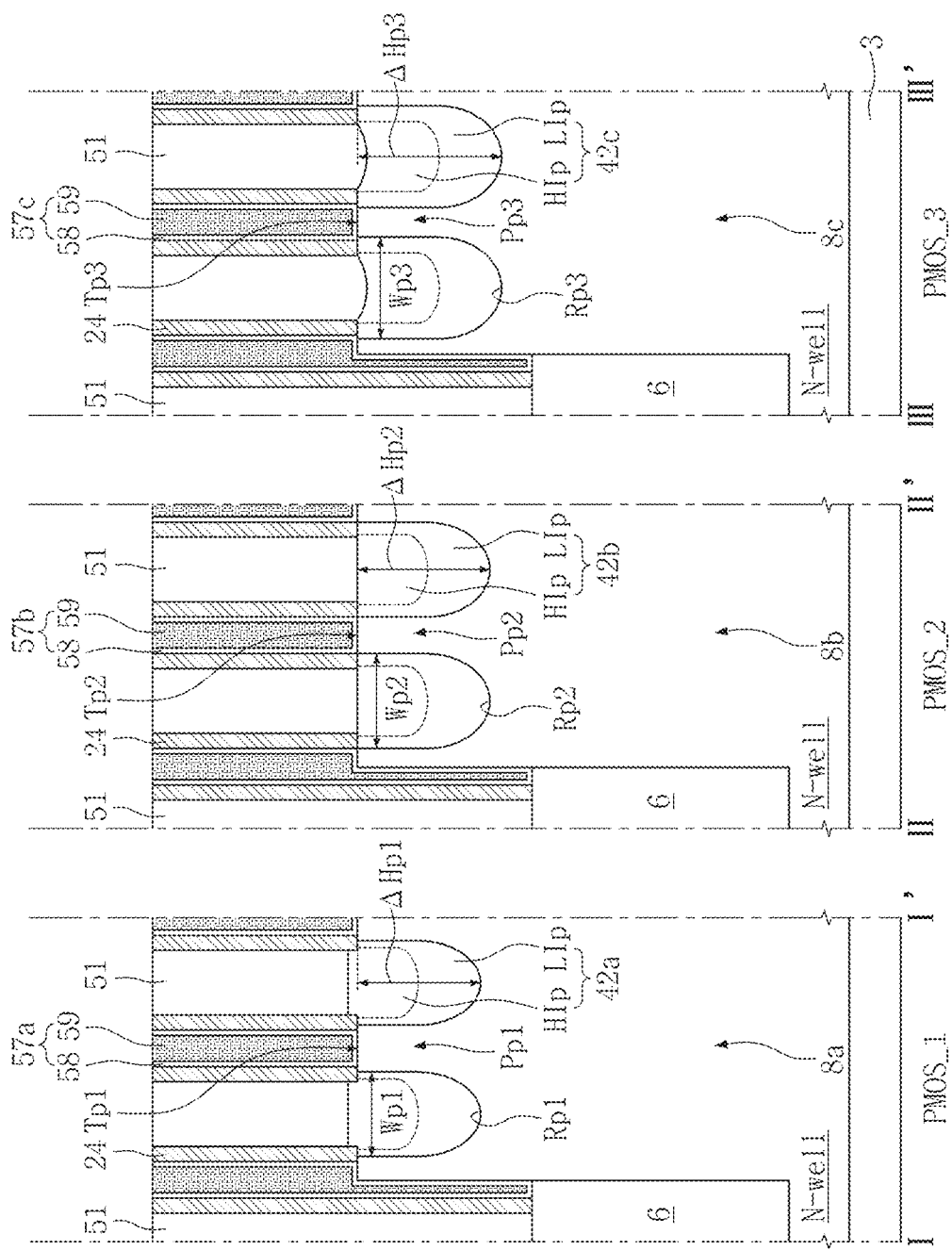
Figure 12C:
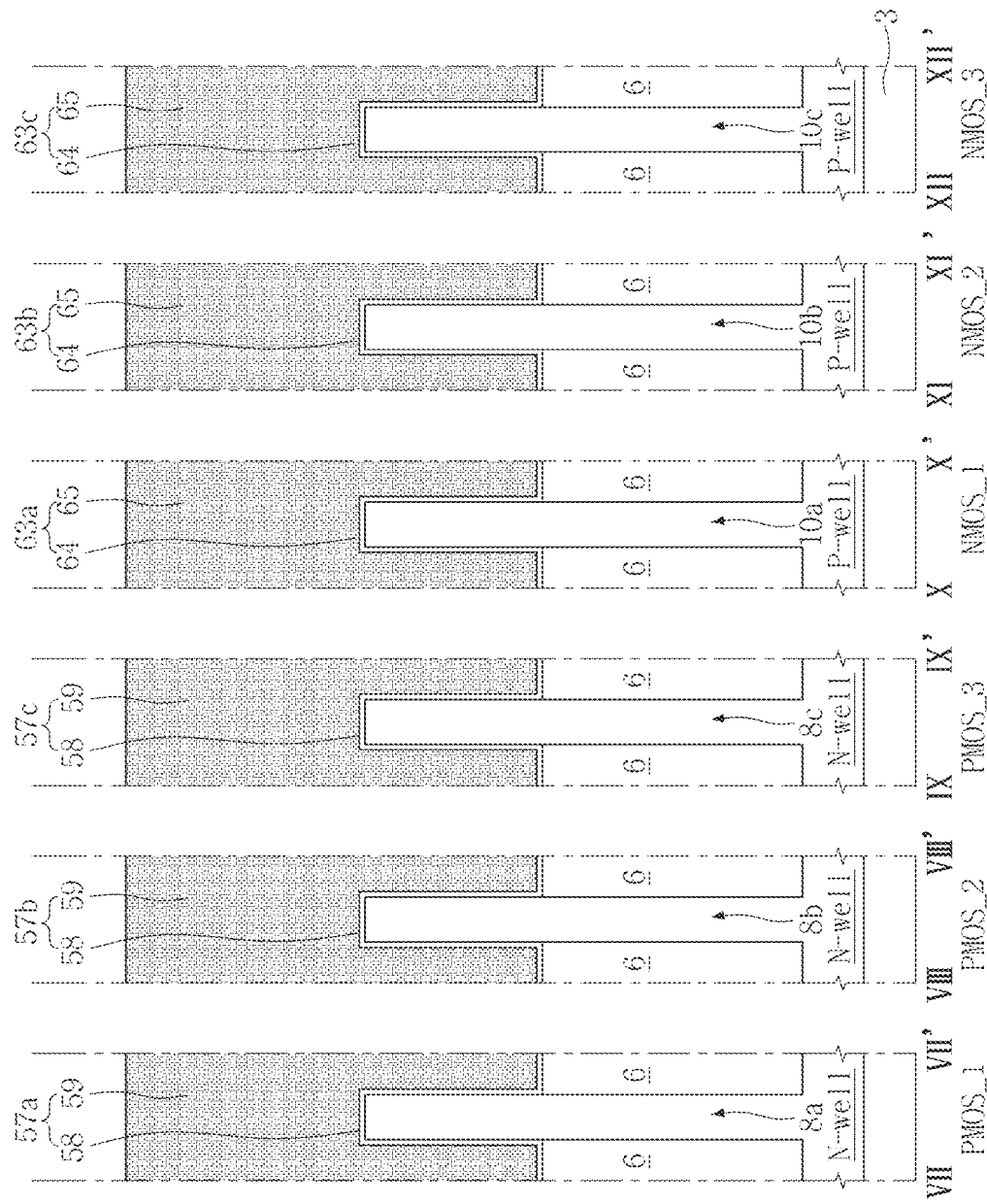

As shown in FIG. 12A, each of the first to third PMOS gate structures 57a, 57b, and 57c may include a PMOS gate dielectric 58 and a PMOS gate electrode 59. In an embodiment, the PMOS gate dielectric 58 may cover bottom and side surfaces of the PMOS gate electrode 59.

As shown in FIG. 12B, each of the first to third NMOS gate structures 63a, 63b, and 63c may include an NMOS gate dielectric 64 and an NMOS gate electrode 65. In an embodiment, the NMOS gate dielectric 64 may cover bottom and side surfaces of the NMOS gate electrode 65.

Referring again to FIGS. 1, 2, 3A, 3B, and 3C, the method of forming a semiconductor device in accordance with an embodiment of the inventive concept may include forming first to third PMOS silicide layers 68p1, 68p2, and 68p3, first to third NMOS silicide layers 68n1, 68n1, and 68n3, first to third PMOS contact structures 72p1, 72p2, and 72p3, and first to third NMOS contact structures 72n1, 72n2, and 72n3.

In an exemplary embodiment, the formation of the first to third PMOS silicide layers 68p1, 68p2, and 68p3 and the first to third NMOS silicide layers 68n1, 68n1, and 68n3 may include exposing the first to third PMOS semiconductor layers 42a, 42b, and 42c and the first to third NMOS semiconductor layers 33a, 33b, and 33c by selectively etching the planarized interlayer insulating layer 51 disposed on the first to third PMOS semiconductor layers 42a, 42b, and 42c and the first to third NMOS semiconductor layers 33a, 33b, and 33c in a photolithography and etching process, and forming the first to third PMOS silicide layers 68p1, 68p2, and 68p3 and the first to third NMOS silicide layers 68n1, 68n1, and 68n3 by performing a silicidation process or a salicide process.

The first PMOS silicide layers 68p1 may be formed on the first PMOS semiconductor layers 42a, the second PMOS silicide layers 68p2 may be formed on the second PMOS semiconductor layers 42b, and the third PMOS silicide layers 68p3 are formed on the third PMOS semiconductor layers 42c. The first NMOS silicide layers 68n1 may be formed on the first NMOS semiconductor layers 33a, the second NMOS silicide layers 68n2 may be formed on the second NMOS semiconductor layers 33b, and the third NMOS silicide layers 68n3 may be formed on the third NMOS semiconductor layers 33c.

The formation of the first to third PMOS contact structures 72p1, 72p2, and 72p3 and the first to third NMOS contact structures 72n1, 72n2, and 72n3 may include forming a conductive material layer on a substrate having the first to third PMOS silicide layers 68p1, 68p2, and 68p3 and the first to third NMOS silicide layers 68n1, 68n1, and 68n3, and planarizing the conductive material layer.

The first PMOS contact structures 72p1 may be formed on the first PMOS silicide layers 68p1, the second PMOS contact structures 72p2 may be formed on the second PMOS silicide layers 68p2, and the third PMOS contact structures 72p3 may be formed on the third PMOS silicide layers 68p3.

The first NMOS contact structures 72n1 may be formed on the first NMOS silicide layers 68n1, the second NMOS contact structures 72n2 may be formed on the second NMOS silicide layers 68n2, and the third NMOS contact structures 72n3 may be formed on the third NMOS silicide layers 68n3.

Figure 13A:
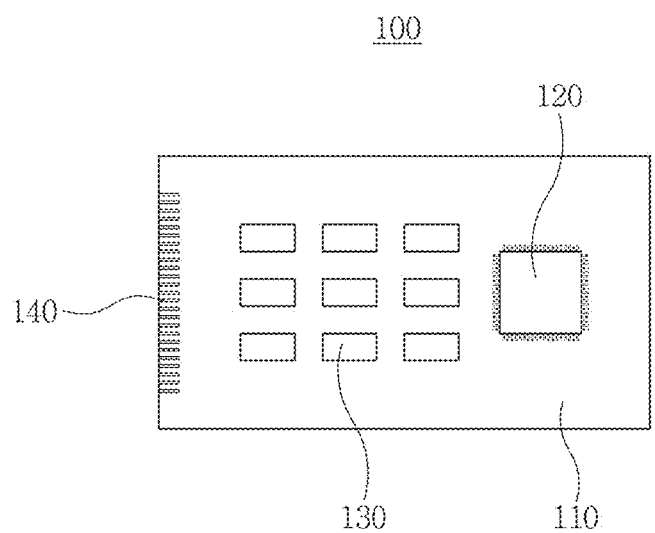
FIG. 13A is a diagram conceptually illustrating a semiconductor module in accordance with an exemplary embodiment of the inventive concept.

FIG. 13A is a diagram conceptually illustrating a semiconductor module in accordance with an exemplary embodiment of the inventive concept.

Referring to FIG. 13A, a semiconductor module 100 in accordance with an embodiment of the inventive concept may include a processor 120 and memory devices 130 mounted on a module substrate 110. Conductive input/output terminals 140 may be disposed on at least one side of the module substrate 110. The processor 120 or the memory devices 130 may include a semiconductor device in accordance with embodiments of the inventive concept. In an embodiment, the module substrate 110 may be a flexible printed circuit board.

Figure 13B:
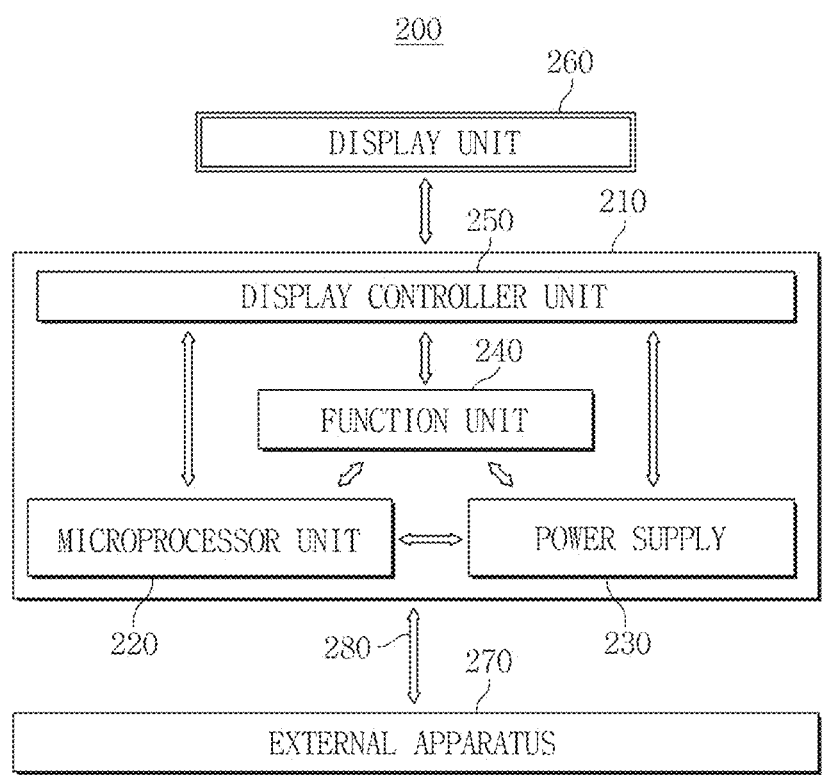
FIGS. 13B and 13C are block diagrams conceptually illustrating electronic systems in accordance with exemplary embodiments of the inventive concept.
Figure 13C:
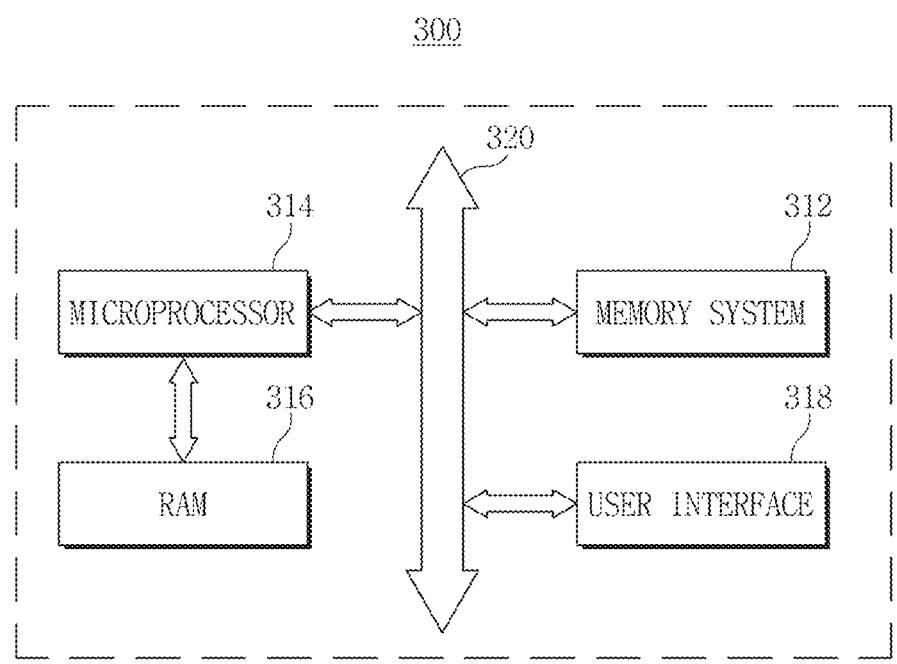

FIGS. 13B and 13C are block diagrams conceptually illustrating electronic systems in accordance with embodiments of the inventive concept.

First, referring to FIG. 13B, an electronic system 200 in accordance with an embodiment of the inventive concept may include a body 210, a display unit 260, and an external apparatus 270. The body 210 may include a microprocessor unit 220, a power supply 230, a function unit 240, and a display controller unit 250. The body 210 may include a system board or motherboard having a printed circuit board (PCB), and/or a case. The microprocessor unit 220, the power supply 230, the function unit 240, and the display controller unit 250 may be installed or disposed on an upper surface or an inside of the body 210. The display unit 260 may be disposed on an upper surface or an inside/outside of the body 210. The display unit 260 may display an image processed by the display controller unit 250. For example, the display unit 260 may include a liquid crystal display (LCD), an active matrix organic light emitting diode (AMOLED), or various other display panels. The display unit 260 may include a touch-screen. Accordingly, the display unit 260 may have an input/output function. The power supply 230 may supply a current or voltage to the microprocessor unit 220, the function unit 240, the display controller unit 250, etc. The power supply 230 may include a rechargeable battery, a socket for a dry cell, or a voltage/current converter. The microprocessor unit 220 may receive a voltage from the power supply 230 to control the function unit 240 and the display unit 260. For example, the microprocessor unit 220 may include a central processing unit (CPU) or an application processor (AP). The function unit 240 may include a touch-pad, a touch-screen, a volatile/nonvolatile memory, a memory card controller, a camera, a light, an audio and video playback processor, a wireless transmission/reception antenna, a speaker, a microphone, a Universal Serial Bus (USB) port, and other units having various functions.

The microprocessor unit 220 or the function unit 240 may include a semiconductor device in accordance with embodiments of the inventive concept.

Next, referring to FIG. 13C, the electronic system 300 in accordance with an embodiment of the inventive concept may include a microprocessor 314, a memory system 312, and a user interface 318 which performs data communication using a bus 320. The microprocessor 314 may include a central processing unit CPU or an application processor AP. The electronic system 300 may further include a random access memory (RAM) 316, which directly communicates with the microprocessor 314. The microprocessor 314 and/or the RAM 316 may be assembled in a single package. The user interface 318 may be used to input data to or output data from the electronic system 300. For example, the user interface 318 may include a touch-pad, a touch-screen, a keyboard, a mouse, a scanner, a voice detector, a cathode ray tube (CRT) monitor, an LCD, an AMOLED, a plasma display panel (PDP), a printer, a light, or various other input/output devices. The memory system 312 may store codes for operating the microprocessor 314, data processed by the microprocessor 314, or external input data. The memory system 312 may include a memory controller, a hard disk, or a solid state drive (SSD). The microprocessor 314, the RAM 316, and/or the memory system 312 may include a semiconductor device formed according to embodiments of the inventive concept.

As set forth above, according to at least one embodiment of the inventive concept, a plurality of transistor areas including gate structures and semiconductor layers are provided. The semiconductor layers may improve carrier mobility in channel areas of transistors and improve performance of the transistors. Each of the semiconductor layers can be formed as an epitaxial layer on a recessed area of an active region by using an SEG process.

The foregoing is illustrative of embodiments and is not to be construed as limiting thereof. Although a few exemplary embodiments have been described, those skilled in the art will readily appreciate that many modifications are possible without materially departing from the inventive concept.

What is claimed is:

1. A semiconductor device comprising:
    a semiconductor substrate including a first transistor area and a second transistor area,
    wherein the first transistor area comprises:
        a first active region disposed on the semiconductor substrate, and including first fin protrusions and a first recessed area disposed between the first fin protrusions;
        first gate structures disposed on the first fin protrusions; and
        a first semiconductor layer disposed in the first recessed area, wherein the second transistor area comprises:
        a second active region disposed on the semiconductor substrate, and including second fin protrusions and a second recessed area disposed between the second fin protrusions, and having the same conductivity type as the first active region;
        second gate structures disposed on the second fin protrusions; and
        a second semiconductor layer disposed in the second recessed area,
    wherein a distance between the first gate structures is the same as a distance between the second gate structures, and
    wherein a height difference between a top surface of each of the second fin protrusions and a bottom surface of the second recessed area is greater than a height difference between a top surface of each of the first fin protrusions and a bottom surface of the first recessed area,
    wherein a density of an area of the first transistor area is greater than a density of an area of the second transistor area.

2. The semiconductor device of claim 1, wherein a top surface of the first semiconductor layer is higher than a top surface of the second semiconductor layer.

3. The semiconductor device of claim 1, wherein the second semiconductor layer has a greater width than the first semiconductor layer.

4. The semiconductor device of claim 1, wherein the first and second semiconductor layers are epitaxial layers formed of the same material.

5. The semiconductor device of claim 1, wherein the first and second semiconductor layers have different conductivity types from the first and second active regions, respectively.

6. The semiconductor device of claim 1, wherein each of the first and second semiconductor layers includes a low-concentration impurity area and a high-concentration impurity area disposed on the low-concentration impurity area.

7. The semiconductor device of claim 1, wherein each of the first fin protrusions includes a top surface facing each of the first gate structures and two side surfaces facing each of the first gate structures and opposite to each other, and each of the second fin protrusions includes a top surface facing each of the second gate structures and two side surfaces facing each of the second gate structures and opposite to each other.

8. A semiconductor device comprising:
a semiconductor substrate including a first area and a second area;
a first PMOS transistor area disposed in the first area of the semiconductor substrate; and
a second PMOS transistor area disposed in the second area of the semiconductor substrate,
wherein the first PMOS transistor area includes first PMOS gate structures overlapping first PMOS fin protrusions of a first PMOS active region disposed on the semiconductor substrate, and a first PMOS semiconductor layer disposed in a first PMOS recessed area between the first PMOS fin protrusions,
wherein the second PMOS transistor area includes second PMOS gate structures overlapping second PMOS fin protrusions of a second PMOS active region disposed on the semiconductor substrate, and a second PMOS semiconductor layer disposed in a second PMOS recessed area between the second PMOS fin protrusions,
wherein a distance between the first PMOS gate structures is the same as a distance between the second PMOS gate structures,
wherein the second PMOS recessed area is deeper than the first PMOS recessed area, and
wherein a density of the first PMOS transistor area in the first area is greater than a density of the second PMOS transistor area in the second area.

9. The semiconductor device of claim 8, wherein a top surface of the first PMOS semiconductor layer is higher than a top surface of the second PMOS semiconductor layer.

10. The semiconductor device of claim 8, further comprising a third PMOS transistor area disposed in a third area of the semiconductor substrate,
wherein the third PMOS transistor area includes third PMOS gate structures overlapping third PMOS fin protrusions of a third PMOS active region disposed on the semiconductor substrate, and a third PMOS semiconductor layer disposed in a third PMOS recessed area between the third PMOS fin protrusions.

11. The semiconductor device of claim 10, wherein a distance between the third PMOS gate structures is the same as the distance between the first PMOS gate structures, and
wherein the third PMOS recessed area is deeper than the second PMOS recessed area.

12. The semiconductor device of claim 8, further comprising:
a first NMOS transistor area in the first area of the semiconductor substrate; and
a second NMOS transistor area in the second area of the semiconductor substrate,
wherein the first NMOS transistor area includes first NMOS gate structures overlapping first NMOS fin protrusions of a first NMOS active region disposed on the semiconductor substrate, and a first NMOS semiconductor layer disposed in a first NMOS recessed area between the first NMOS fin protrusions,
wherein the second NMOS transistor area includes second NMOS gate structures overlapping second NMOS fin protrusions of a second NMOS active region disposed on the semiconductor substrate, and a second NMOS semiconductor layer disposed in a second NMOS recessed area between the second NMOS fin protrusions,
wherein a distance between the first NMOS gate structures is the same as a distance between the second NMOS gate structures, and
wherein the first NMOS recessed area is deeper than the second NMOS recessed area.

13. The semiconductor device of claim 12, wherein a density of the second NMOS transistor area in the second area is greater than a density of the first NMOS transistor area in the first area.

14. The semiconductor device of claim 12, wherein the first and second PMOS recessed areas are deeper than the first and second NMOS recessed areas.

15. The semiconductor device of claim 12, further comprising a third NMOS transistor area disposed in the third area of the semiconductor substrate,
wherein the third NMOS transistor, area includes third NMOS gate structures overlapping third NMOS fin protrusions of a third NMOS active region disposed on the semiconductor substrate, and a third NMOS semiconductor layer disposed in a third NMOS recessed area between the third NMOS fin protrusions,
wherein a density of the third NMOS transistor area disposed in the third area is greater than a density of the second NMOS transistor area disposed in the second area, and
wherein the second NMOS recessed area is deeper than the third NMOS recessed area.

16. A semiconductor device comprising:
a semiconductor substrate;
a first active region disposed on the semiconductor substrate, and including first protrusions and a first recessed area disposed between the first protrusions;
first gate structures disposed on the first protrusions;
a first semiconductor layer disposed in the first recessed area;
a second active region disposed on the semiconductor substrate, and including second protrusions and a second recessed area disposed between the second protrusions, and having the same conductivity type as the first active region;
second gate structures disposed on the second protrusions; and
a second semiconductor layer disposed in the second recessed area,
wherein a distance between the first gate structures is the same as a distance between the second gate structures, and
wherein a height difference between a top surface of one of the second protrusions and a bottom surface of the second recessed area is greater than a height difference between a top surface of one of the first protrusions and a bottom surface of the first recessed area,
wherein a density of an area of the first transistor area is greater than a density of an area of the second transistor area.

17. The semiconductor device of claim 16, wherein a top surface of the first semiconductor layer is higher than a top surface of the second semiconductor layer.

18. The semiconductor device of claim 16, wherein the second semiconductor layer has a greater width than the first semiconductor layer.

* * * * *